(12) United States Patent
Kurma Raju et al.

(10) Patent No.: US 11,755,080 B2
(45) Date of Patent: *Sep. 12, 2023

(54) THERMAL DISSIPATION IN DUAL-CHASSIS DEVICES

(71) Applicant: Intel Corporation, Santa Clara, CA (US)

(72) Inventors: Prakash Kurma Raju, Bangalore (IN); Babu Triplicane Gopikrishnan, Bangalore (IN); Bijendra Singh, Bangalore (IN); Prasanna Pichumani, Bangalore (IN); Raghavendra Doddi, Bangalore (IN); Harish Jagadish, Bangalore (IN); Gopinath Kandasamy, Bangalore (IN); David Pidwerbecki, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/560,719

(22) Filed: Dec. 23, 2021

(65) Prior Publication Data

US 2022/0113759 A1 Apr. 14, 2022

Related U.S. Application Data

(63) Continuation of application No. 16/052,590, filed on Aug. 1, 2018, now Pat. No. 11,231,757.

(51) Int. Cl.
*G06F 1/20* (2006.01)
*G06F 1/16* (2006.01)
(Continued)

(52) U.S. Cl.
CPC ............ *G06F 1/203* (2013.01); *G06F 1/1616* (2013.01); *G06F 1/1637* (2013.01);
(Continued)

(58) Field of Classification Search
CPC ... H01L 23/473; H01L 23/467; H01L 23/373; H01L 23/3672; G06F 1/203;
(Continued)

(56) References Cited

U.S. PATENT DOCUMENTS 6,324,055 B1 11/2001 Kawabe
10,359,241 B2 7/2019 Morrison et al.
(Continued)

OTHER PUBLICATIONS

USPTO Jan. 10, 2020 Nonfinal Rejection from U.S. Appl. No. 16/052,690.
(Continued)

*Primary Examiner* — Adam B Dravininkas
(74) *Attorney, Agent, or Firm* — Patent Capital Group

(57) ABSTRACT

There is disclosed a computing apparatus, including: a first chassis including primary operational circuitry of the computing apparatus; a second chassis hingeably coupled to the second chassis, the second chassis having substantially less operational circuitry than the first chassis whereby the operational circuitry of the second chassis generates substantially less heat than the operational circuitry of the first chassis; and a heat spreader between the first chassis and second chassis and disposed to dissipate generated heat from the first chassis into the second chassis.

14 Claims, 19 Drawing Sheets

(51) Int. Cl.
  *H05K 7/20* (2006.01)
  *G06F 3/041* (2006.01)
  *H04M 1/02* (2006.01)
(52) U.S. Cl.
  CPC .......... *G06F 1/1647* (2013.01); *G06F 1/1681* (2013.01); *H04M 1/022* (2013.01); *H05K 7/2039* (2013.01); *G06F 3/041* (2013.01); *G06F 2200/203* (2013.01); *H04M 1/0216* (2013.01); *H04M 2250/16* (2013.01)
(58) Field of Classification Search
  CPC ................. G06F 1/1616; G06F 1/1681; G06F 2200/201; G06F 1/20; G06F 1/1637; G06F 1/1656; G06F 1/206; G06F 2200/203; F28D 15/0241
  See application file for complete search history.

(56) References Cited

U.S. PATENT DOCUMENTS

| | | |
|---|---|---|
| 2003/0214786 A1 | 11/2003 | Niwatsukino et al. |
| 2004/0114322 A1 | 6/2004 | Agata et al. |
| 2007/0211426 A1 | 9/2007 | Clayton et al. |
| 2009/0071632 A1 | 3/2009 | Bryant et al. |
| 2013/0027886 A1 | 1/2013 | Crooijmans et al. |
| 2014/0009888 A1* | 1/2014 | MacDonald ............ G06F 1/206 361/701 |
| 2016/0212890 A1 | 7/2016 | Jeong et al. |
| 2017/0269634 A1 | 9/2017 | Ji |
| 2018/0092253 A1* | 3/2018 | Qiu .................... H05K 7/20963 |
| 2019/0035324 A1 | 1/2019 | Aurongzeb et al. |
| 2019/0317571 A1 | 10/2019 | North et al. |
| 2019/0317572 A1* | 10/2019 | North ...................... G06F 1/203 |
| 2019/0317574 A1* | 10/2019 | North ...................... G06F 1/203 |

OTHER PUBLICATIONS

USPTO Apr. 29, 2020 Final Rejection from U.S. Appl. No. 16/052,690.
USPTO Sep. 17, 2020 Nonfinal Rejection from U.S. Appl. No. 16/052,690.
USPTO Dec. 28, 2020 Final Rejection from U.S. Appl. No. 16/052,690.

* cited by examiner

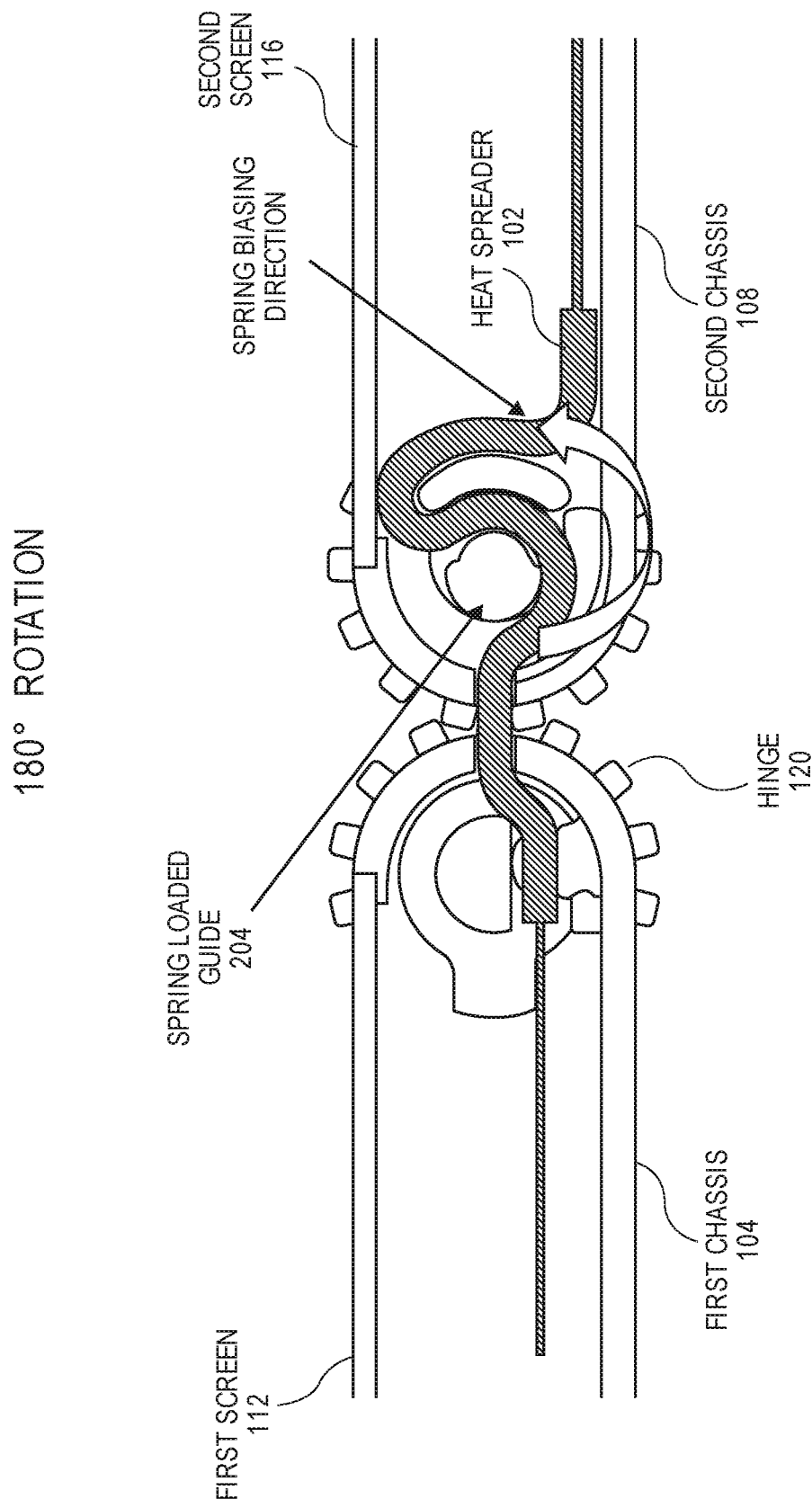

THERMAL DISSIPATION IN DUAL-CHASSIS DEVICES

CROSS REFERENCE TO RELATED APPLICATION

This application is a continuation of U.S. application Ser. No. 16/052,590, filed Aug. 1, 2018, which is incorporated by reference its entirety.

FIELD OF THE SPECIFICATION

This disclosure relates in general to the field of computing devices, and more particularly, though not exclusively, to a system for thermal dissipation in a dual-chassis device.

BACKGROUND

Computing systems that employ very large-scale integrated circuits (VLSI) generate substantial heat.

BRIEF DESCRIPTION OF THE DRAWINGS

The present disclosure is best understood from the following detailed description when read with the accompanying FIGURES. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIG. 2 discloses a more detailed view of the embodiment illustrated in FIG. 1B.

EMBODIMENTS OF THE DISCLOSURE

Figure 1A:
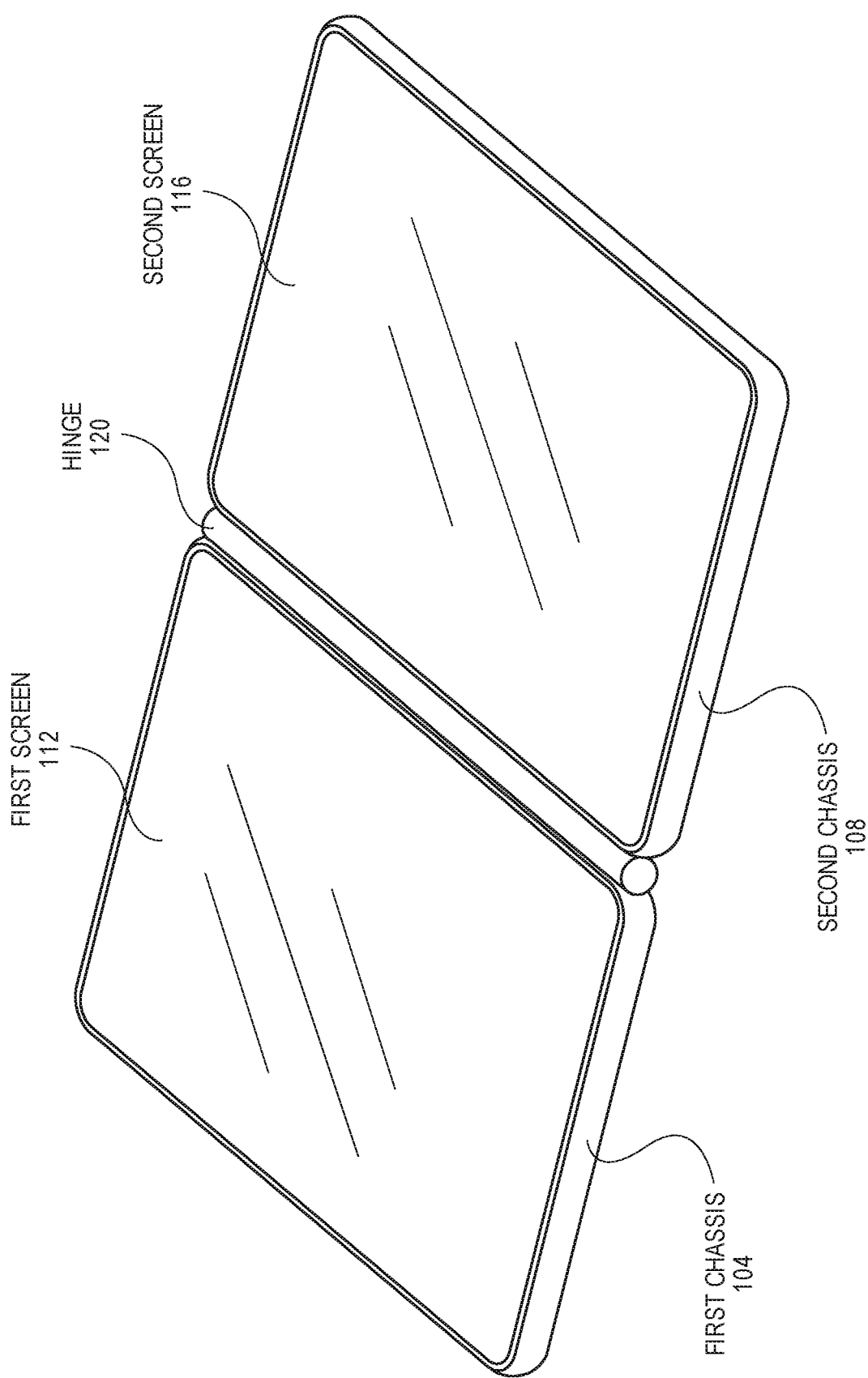
FIG. 1A is a perspective view of a converged mobility device.

The following disclosure provides many different embodiments, or examples, for implementing different features of the present specification. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

Converged mobility devices are a class of devices that merge some of the desirable features of mobile phones, tablets, laptops, or other portable computers. For example, a device with a 7 or 8-inch screen diagonal may be considered a large phone or a small tablet. Such devices are traditionally less powerful than full laptop computers, but converged mobility seeks to deliver laptop or netbook-like power in a phone-like form factor.

As a general principle, heat generated varies directly with the computing power delivered, and inversely with size. The computing power itself can include multiple factors, such as the number of transistors as well as the clock speed at which gates operate. While advances in processor design have made it possible to design very small form factor processors with very high compute capabilities, the heat generated by such systems can in some cases be prohibitive. So while there are many computing platforms (e.g., systems-on-a-chip) that are small enough to fit within a converged mobility form factor, heat can make it impractical to operate such devices at the desired speeds.

The present specification illustrates novel heat dissipation structures and techniques that can enable a smaller device, such as a converged mobility device having two or more chassis, to dissipate enough of the heat generated by its processing elements to have power that has traditionally been characteristic of much larger devices, such as tablets, netbooks, or laptops.

One example of a converged mobility device is a "pocketable tablet" with dual screens. Each screen is housed in a chassis and may be, for example, between six to eight inches approximately. The two chassis are joined by a hinge, which in some cases allows a full 360 rotation of the chassis with respect to one another. The two chassis are also electronically communicatively coupled, such as by a cable or circuit passing through the hinge, thus enabling the two chassis to operate as a single device. With the two screens folded onto one another (e.g., 0° rotation), the device is ready for storage, similar to a "flip phone." With the first chassis (which may contain the primary circuitry, such as the processor, memory, and other controllers, which may be embodied in a system-on-a-chip) at or around 90° with respect to the second chassis, the device can be used similar to a small laptop, possibly including a "software keyboard" on the second chassis. With the two chassis at 180° with respect to one another, the device may be used more like a traditional tablet, with both screens displaying data. With the two chassis folded so that the backs are to one another (e.g., 360°), the second screen may be inactive, and the device may be used like a smart phone, with the first screen providing primary input and output. These configurations should be understood to be nonlimiting and illustrative only.

In a dual display system, such as those used in converged mobility, the compute and high-power devices generally reside in one section (such as a first chassis), while the other section (such as a second chassis) houses relatively low-power components (e.g., a simple display driver and I/O drivers). In these devices, especially when they are passively cooled, heat generation comes primarily from the first, higher-powered section. Spreading the heat from the section that houses the high-power compute components to the section that has lower-power devices can help to ensure higher overall heat dissipation for the system. This reduces the operating temperature difference between the segments for better ergonomics, and allows the use of higher-power components in the first chassis.

Embodiments of the present specification include a converged mobility or similar device having a plurality of chassis. The primary compute capability (such as discrete processor, memory, and peripherals, or a system-on-a-chip) may be located within the first chassis, while the secondary chassis may have secondary capabilities, such as a simple display capability. Because the second chassis generates much less heat than the first chassis, the second chassis can usefully be treated as a heat sink for dissipating the heat of the first chassis. To accomplish this heat spreading, a heat conductive flexible heat spreader may be disposed from the first chassis to the second chassis. In one example, this heat spreader may be constructed of a highly heat conductive material such as graphite. In other cases, the heat spreader may be constructed of other materials such as a conductive metal such as copper, gold, or silver, or a metal alloy. Graphite has been found to have advantages because it is highly heat conductive, while it also has the ability to withstand many cycles of bending and unbending. For example, experimentally, the heat spreaders of the present specification have been found to withstand a minimum of 30,000 bend cycles. Furthermore, the heat spreader can be cosmetically enhanced as well as given protection by sandwiching it within a protective layer, such as silicone rubber or microfiber.

In embodiments disclosed herein, the heat spreader, along with any encasing material, and optionally also along with a connecting cable or a flexible printed circuit (FPC) can be disposed through a guide in at least one of the two chassis. In some examples, the guide is spring-loaded, or has other biasing means, so that the length of the heat spreader extends or contracts responsive to a folding or unfolding action of the converged mobility device. Many such converged mobility devices have full 360° folding capabilities, which enables a device, for example, to provide the converged mobility experience. Taking as an example a device with an 8-inch screen diagonal, the device may be folded a full 360°. Thus, when folded, the device can act as a pocketable tablet, or as a cell phone. When unfolded, the device has two 8-inch screens, and can thus act more like a full-featured tablet. Furthermore, because the teachings of the present specification enable the device to have greater compute power than it would have without enhanced heat dissipation capabilities, a user may employ a detachable or wireless keyboard (such as a Bluetooth keyboard) and use the device more like a traditional laptop or netbook.

A system and method for providing thermal dissipation in dual-chassis devices will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1A is a perspective view of a converged mobility device 100. Converged mobility device 100 may be, for example, a pocketable tablet, with a dual screen configuration. The dual screen configuration provides advantages, for example if the device is to be used as a phone, one screen can be folded under the other so that the device assumes a phone-like form factor. However, if the device is to be used as a tablet or a laptop, the second screen can be folded out. This provides a more laptop-like experience.

In this example, converged mobility device 100 includes a first chassis 104 and a second chassis 108. First chassis 104 includes a first screen 112, while second chassis 108 includes a second screen 116. First screen 112 and second screen 116 may be, for example, touchscreens such as are commonly used in phones and tablets. First chassis 104 and second chassis 108 are connected by a hinge 120. Hinge 120 allows, in one example, a full 360° movement so that second screen 116 can be folded completely onto first screen 112 (e.g., for storage), or can be folded all the way under first screen 112 (e.g., when converged mobility device 100 is used as a phone). In other examples, first screen 112 can be folded up to an angle between approximately 0 and 90°, and second screen 116 can provide a software keyboard. This allows converged mobility device 100 to be used more like a laptop or a tablet.

It should also be noted that converged mobility device 100 may include more than two screens in various configurations.

Figure 1B:
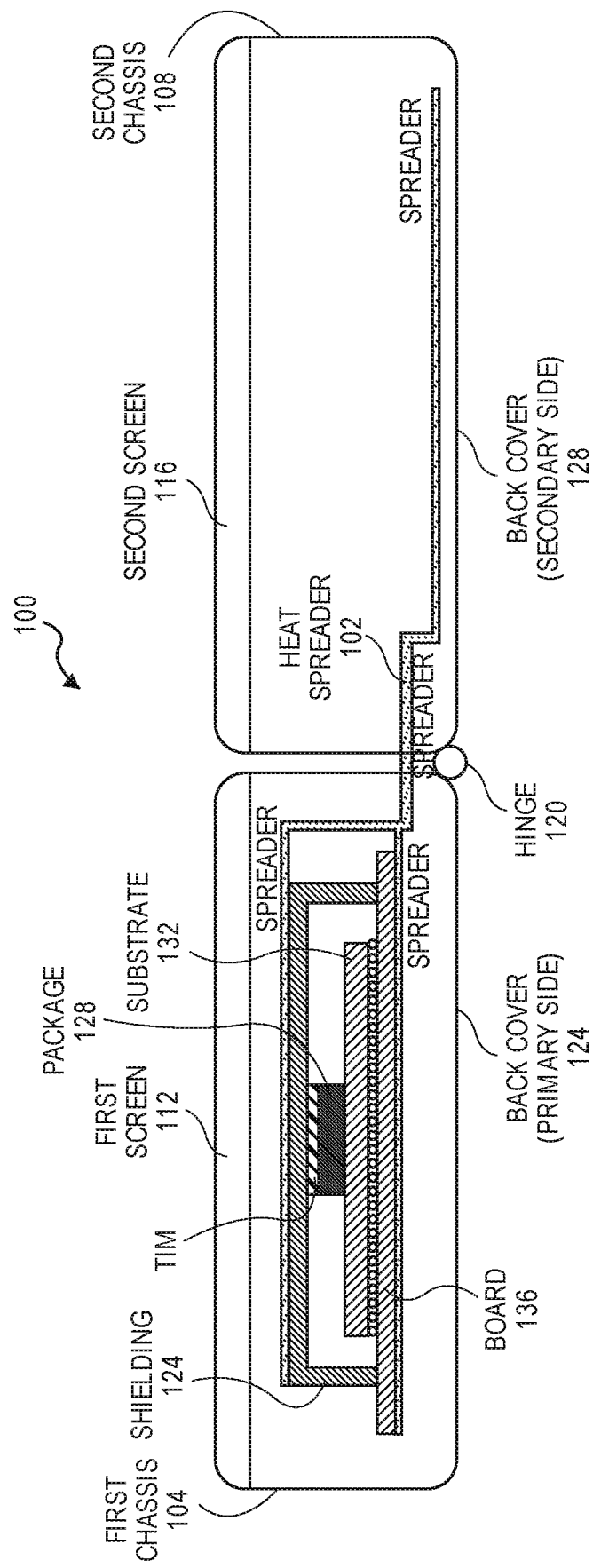
FIG. 1B illustrates additional internal details of a converged mobility device.

FIG. 1B illustrates additional internal details of converged mobility device 100. Visible on FIG. 1B is first screen 112, and second screen 116 within first chassis 104 and second chassis 108, respectively. First chassis 104 may be treated as a "primary" chassis, and may include the primary electronic components. This may include, for example, a package 128 including a system-on-a-chip, and/or other electronics, including a processor, memory, and other elements, such as elements illustrated in FIGS. 14, 15, 16, and 17. Package 128 may be mounted on a substrate 132, which itself may be mounted to a board 136, such as a printed circuit board. This example is illustrated with a bead-type mounting, which is common in these types of systems.

Shielding 124 may provide electromagnetic interference (EMI) and electromagnetic frequency (EMF) protection for package 128.

Second screen 116 may be driven by additional circuitry within second chassis 108. But in this configuration, first chassis 104 generates substantially more heat than second chassis 108. Thus, between first chassis 104 and second chassis 108, there may be provided a hinge 120, which may include a compact guiding mechanism to allow a heat spreader 102 to pass from first chassis 104 to second chassis 108. This allows heat generated in first chassis 104 to be shared between first chassis 104 and second chassis 108. This substantially increases the thermal budget, for example, for package 128.

By way of example, hinge 120 may include a spring-loaded guiding mechanism that retracts or withdraws heat spreader 102, according to device usage modes and configurations that affect the angle at which the two compartments are oriented with respect to each other.

Heat spreader 102 may be made of any suitable, thermally conductive material. A graphite sheet of approximately 50 to 100 microns is particularly effective for this purpose, because it is flexible and is not brittle. Indeed, a graphite sheet of this type may be three to four times more thermally conductive than a comparable metal. Furthermore, a simple metal sheet may not meet the bendability requirements. For example, the graphite sheet disclosed herein has been tested and has been found to withstand a minimum of 30,000 bend cycles, which would be sufficient to fracture many pure metal sheets. However, metal alloys, foils, or other configurations that permit a large number of bend cycles could also be used.

FIG. 2 discloses a more detailed view of this embodiment, in which there is shown first screen 112, second screen 116 disposed within first chassis 104, and second chassis 108. A geared hinge 120 is disposed between first chassis 104 and second chassis 102. Disposed within second chassis 108 is a spring-loaded guide 204 with a spring-biasing direction as illustrated. Heat spreader 102 may pass through an aperture of first chassis 104 and a second aperture of second chassis 108, and then through spring-loaded guide 204. As hinge 120 is operated and the angle between the two chassis changes, spring-loaded guide 204 expands or retracts heat spreader 102 to accommodate the new angle. FIG. 2 illustrates the two chassis in a 180° rotation with respect to each other.

With converged mobility device 100 in a folded configuration (e.g., 0° or 360°), the path and trajectory of the heat spreader is maximum. At the 180° position, the length of the heat spreader is at its minimum.

The spring system may be loaded or unloaded based on the orientation of the device. Torque provided by the spring rotates guide 204 counterclockwise, which in turn retracts the graphite sheet when the device is rotated, for example, from 0° to 180°. Similarly, when the device is rotated from 180° to 0°, the guide is rotated clockwise by working against the spring torque. This new position of guide 204 allows the heat spreader the benefit of additional length. With the illustrated configuration, the length of the heat spreader is adjusted and guided according to the orientation of the device. The required minimum bending radius of the heat spreader is controlled by the guide profile, thereby enabling multiple close and open operations of the device without damaging the heat spreader.

A major challenge of heat spreader 102 is that it may be damaged due to repeated closing and opening of the device. It is thus advantageous to provide a solution for a robust heat spreader that does not compromise space available for a printed circuit board (PCB), batteries, and other components.

Figure 3:
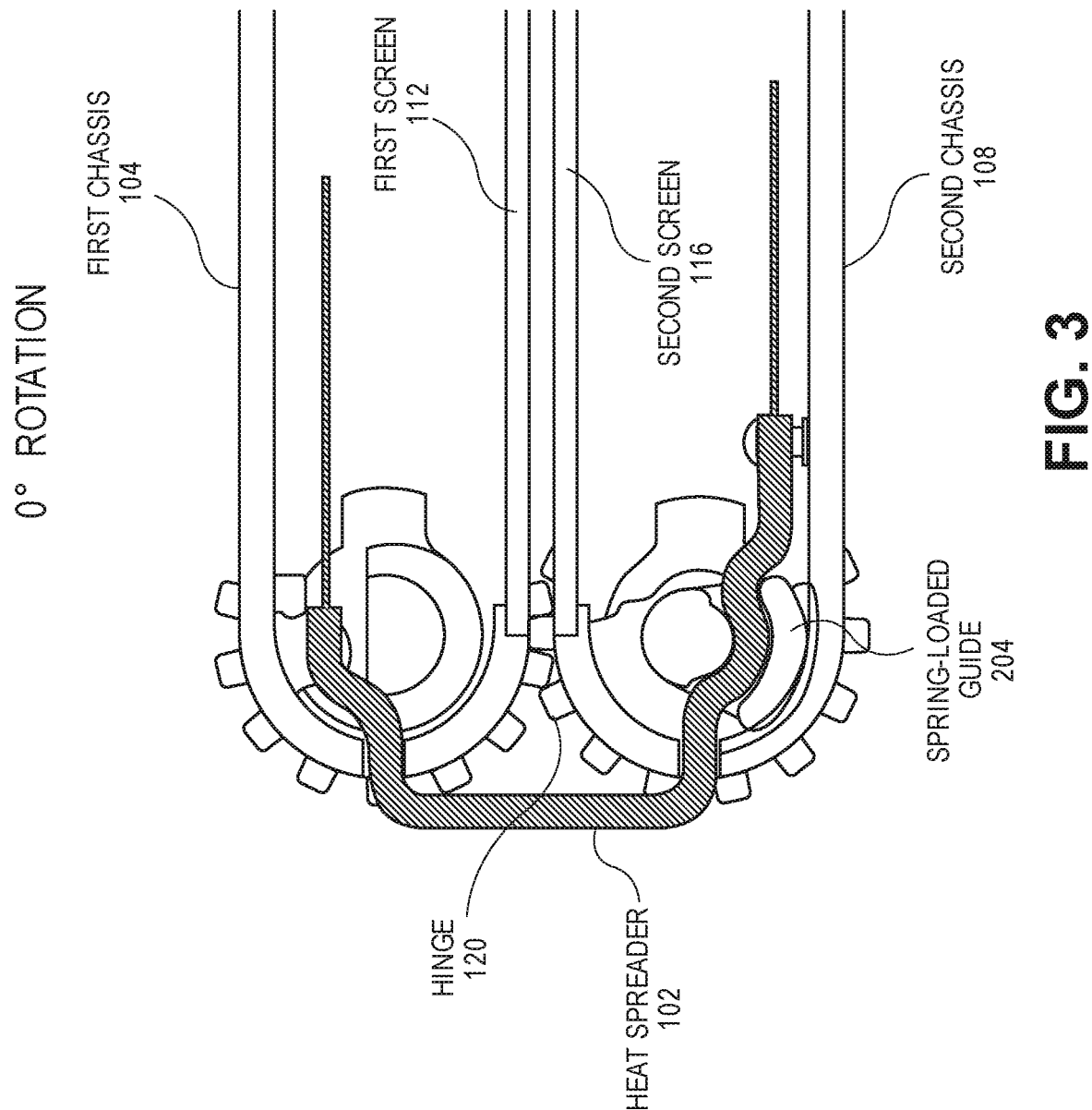
FIG. 3 illustrates an additional cutaway side view of a converged mobility device.

FIG. 3 illustrates an additional cutaway side view of converged mobility device 100. In the example of FIG. 3, there is shown again chassis 1 104, chassis 2 108, spring-loaded guide 204, heat spreader 102, and hinge 120. In this illustration, the two chassis are in a 0° rotation with respect to each other. In this example, heat spreader 102 may be expanded to its maximum extent.

Figure 4:
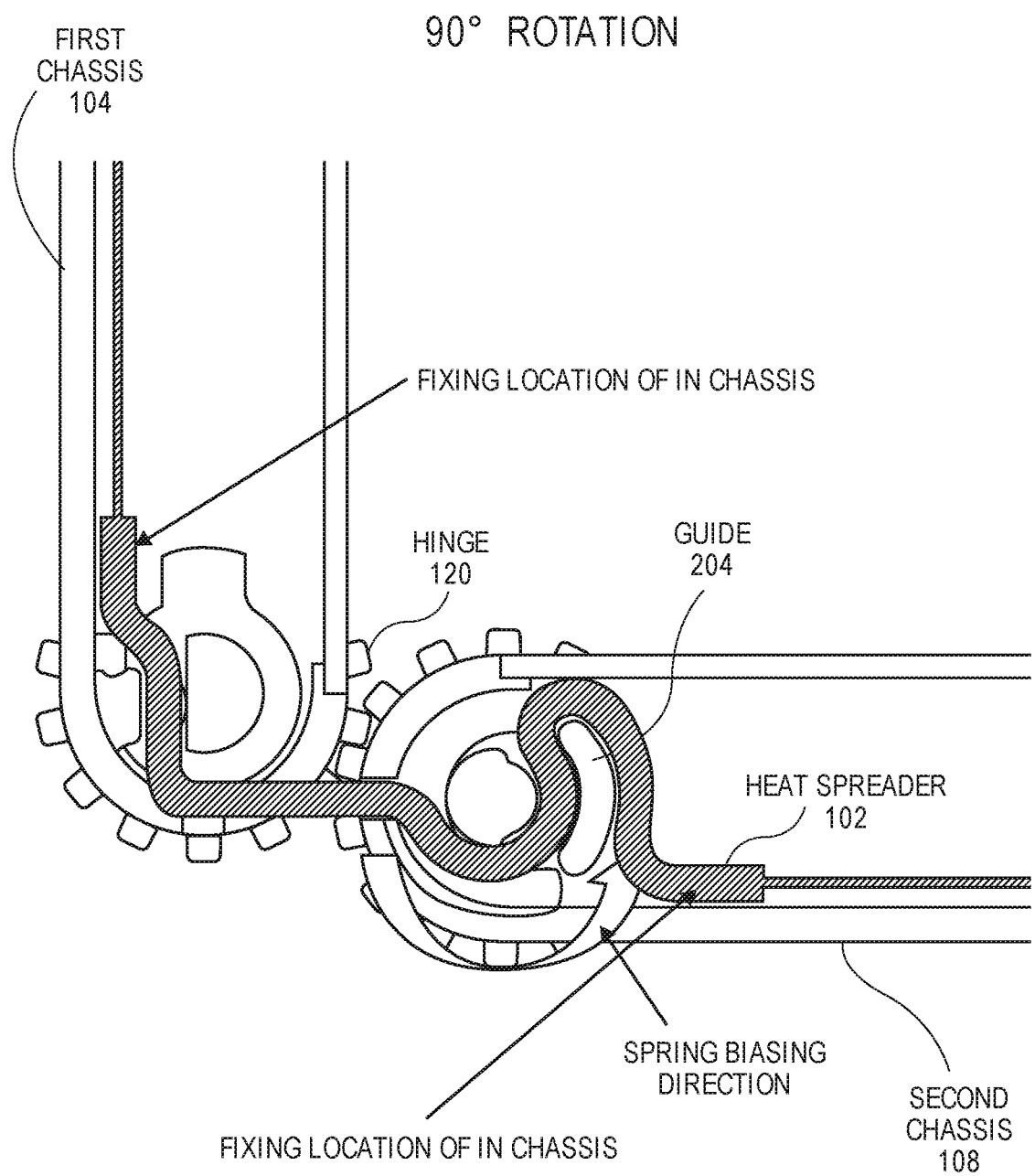
FIG. 4 illustrates a further cutaway view of a converged mobility device.

FIG. 4 illustrates a further cutaway view of converged mobility device 100, including first chassis 104, second chassis 108, hinge 120, heat spreader 102, and spring-loaded guide 204. In the example of FIG. 4, the two chassis are in a 90° rotation with respect to one another, such as when the device may be used in a laptop or tablet mode, with the second screen acting as either a secondary screen or as a software keyboard.

Figure 5:
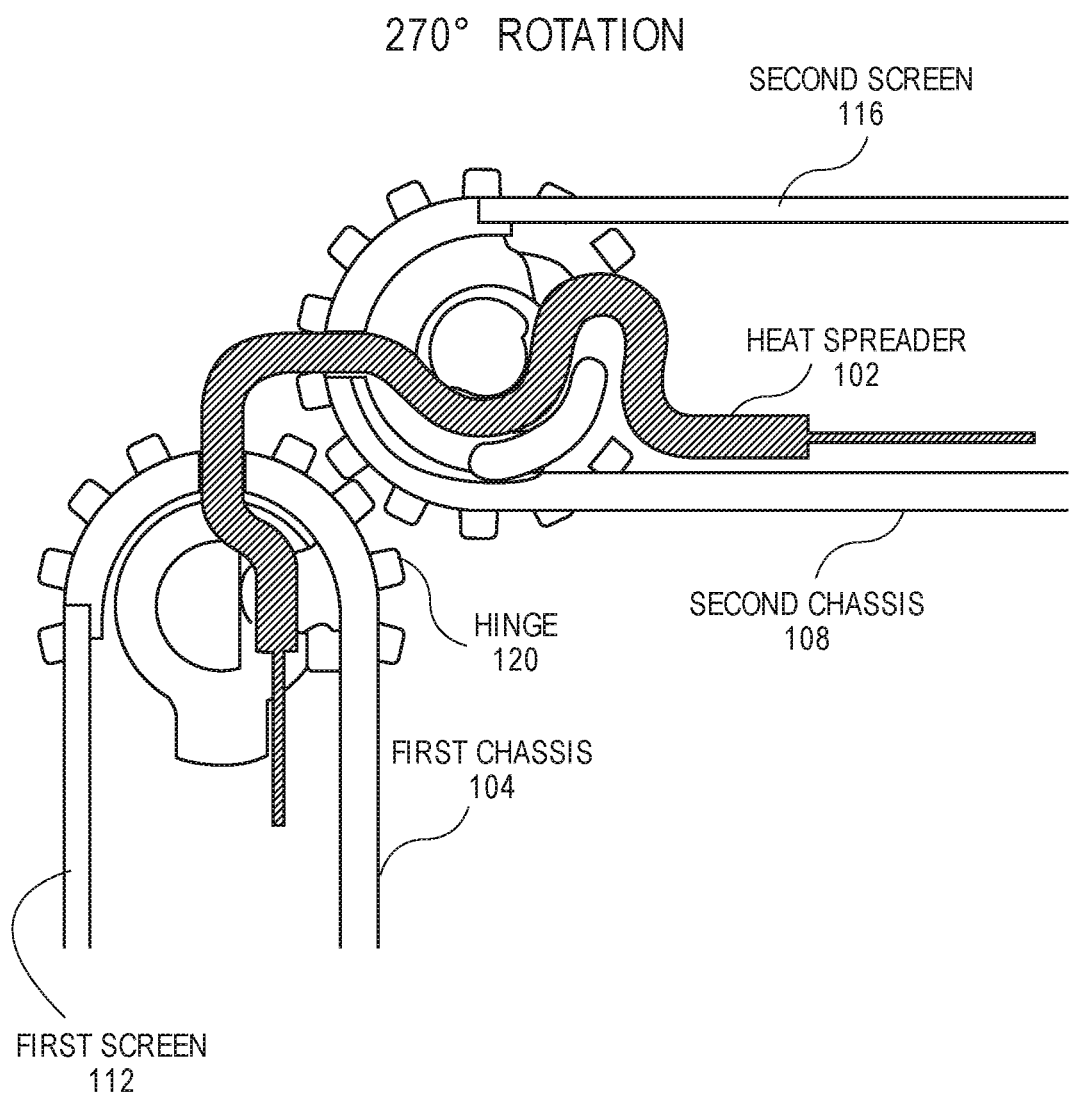
FIG. 5 illustrates another orientation of a converged mobility device.

FIG. 5 illustrates yet another orientation of converged mobility device 100, in which there is again shown first chassis 104, second chassis 108, heat spreader 102, and hinge 120. In this case, and in the case of the 90° rotation of FIG. 4, heat spreader 102 is partly extended.

Figure 6:
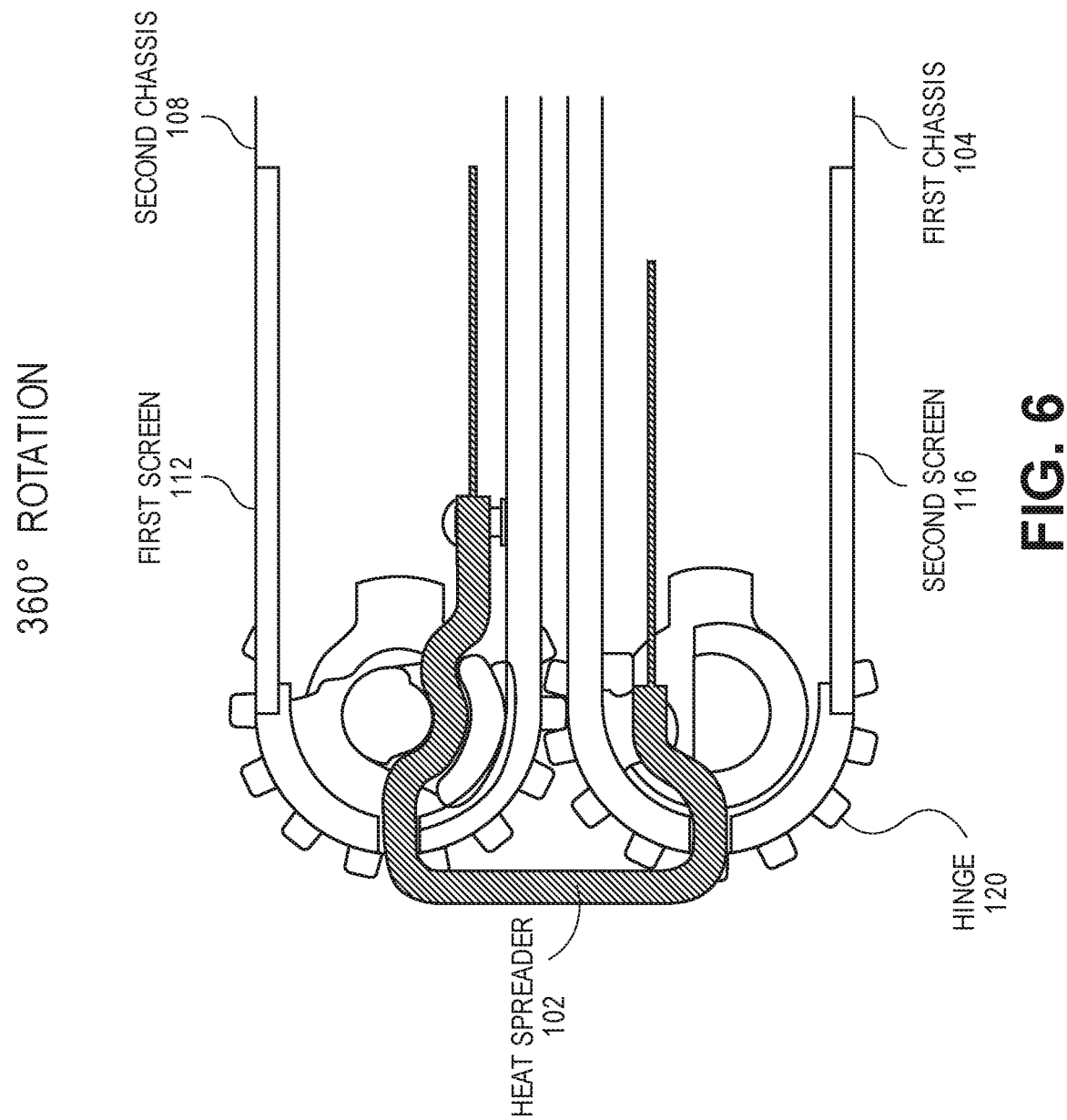
FIG. 6 illustrates the dual chassis of a converged mobility device in a 360° rotation with respect to one another.

FIG. 6 illustrates chassis 104 and chassis 108 in a 360° rotation with respect to one another. Again, heat spreader 102 and hinge 120 are shown. The 360° rotation may be used, for example, when converged mobility device 100 is to be used as a phone. This provides a compact form factor, and because both chassis are relatively thin, the device is still a suitable size to be held in a hand. The contraction of heat spreader 102 in this configuration is similar to the contraction of heat spreader 102 as illustrated in the 0° rotation in FIG. 3.

Figure 7:
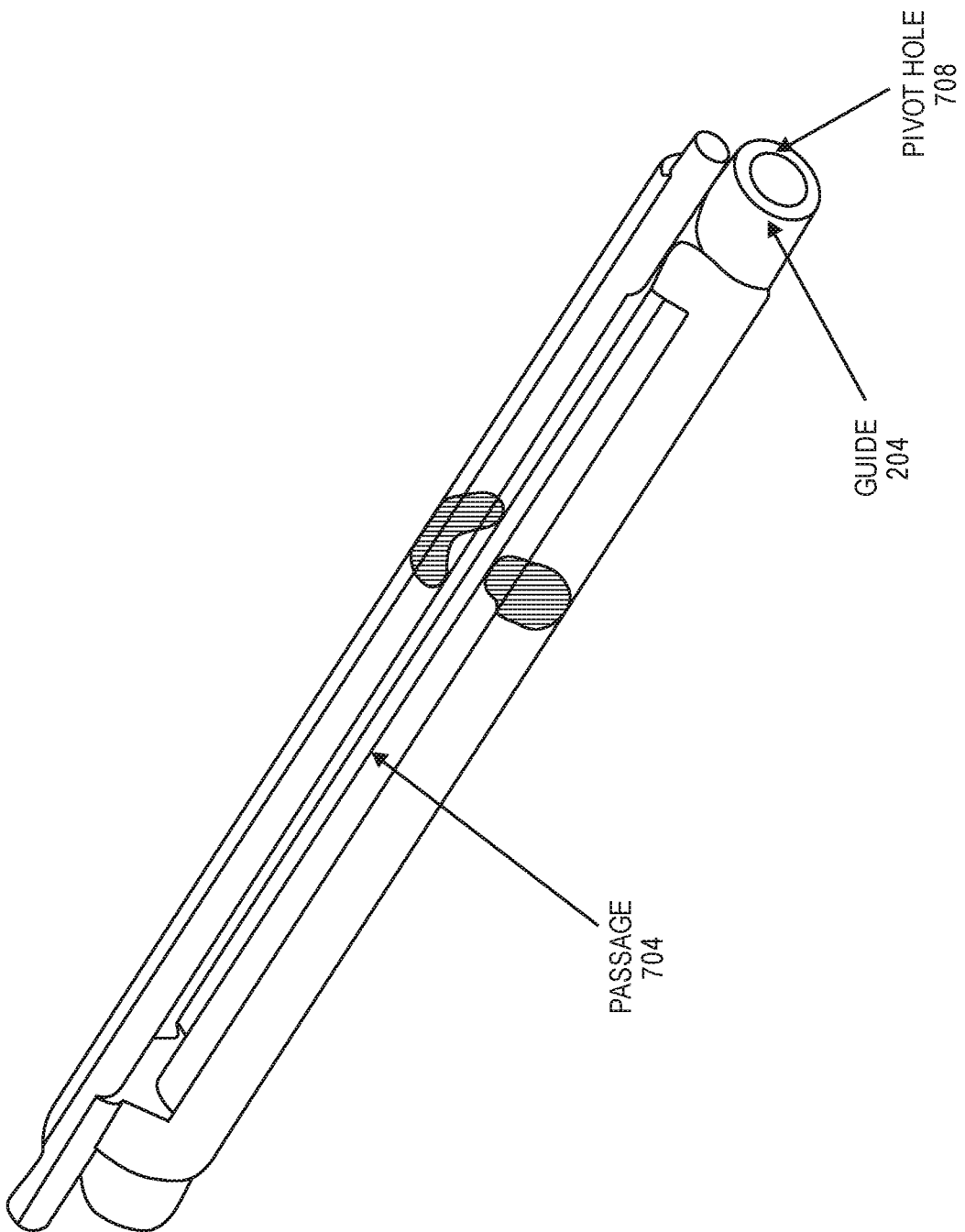
FIG. 7 is a detailed perspective view of a guide.

FIG. 7 is a more detailed perspective view of guide 204. In the example of FIG. 7, guide 204 includes a pivot hole 708 and a passage 704. Pivot hole 708 allows the opening and closing motion, while passage 704 provides the guide mechanism through which the heat spreader passes.

Also illustrated in FIG. 7 is a cutaway view of guide 204, illustrating an example profile of guide 204.

Figure 8:
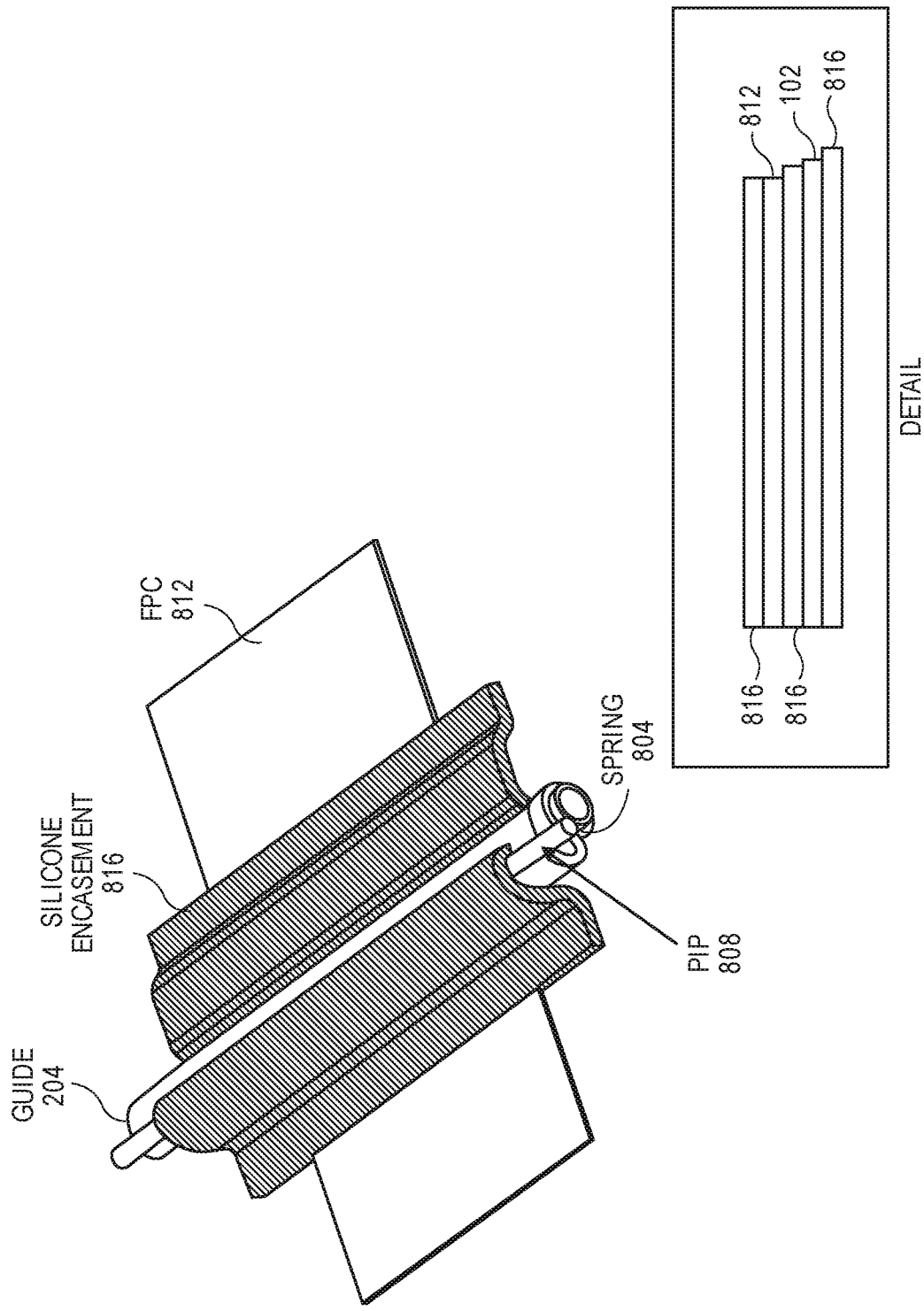
FIG. 8 illustrates interaction between a heat spreader and a guide.

FIG. 8 illustrates interaction between a heat spreader and guide 204. In this illustration, guide 204 further includes a spring 804, or other biasing mechanism, as well as a pip 808 that aids in guiding the heat spreader through guide 204.

Note that in addition to providing a heat spreader between the two chassis, guide 204 may also need to provide an electrical route for communication of signals and power between the two chassis. This enables the second chassis to receive signals and power from the first chassis, which includes the primary computing capability. As can be seen in the foregoing FIGURES, the heat spreader may need to pass through the outside of the device to provide routing between the two chassis. This can entail both cosmetic implications and survivability limitations. For example, if the heat spreader and the routing means are exposed to the open air, they may not only be unsightly, but may be subject to damage. Thus, in this illustration, a silicone encasement 816 is provided around heat spreader 102. Furthermore, a flexible printed circuit (FPC) 812 may also be provided. FPC 812 may be a flexible printed circuit made, for example, of polyimide, polyether ether ketone (PEEK), or transparent conductive polyester, by way of illustrative and nonlimiting example. The use of an FPC 812 may provide communication between the two chassis without the need for providing a ribbon cable or other cabling mechanism. This can make the device both more robust and more attractive. By way of illustration, FPC 812 may be between 100 and 200 microns.

As illustrated in the detailed cutaway view, silicone encasement 816 may "sandwich" heat spreader and FPC 812. In other words, a bottom layer of silicone encasement 816 and a top layer of silicone encasement 816 are provided, with heat spreader 102 and FPC 812 in between. In some embodiments, another protective layer of silicone encasement 816 may be provided between heat spreader 102 and FPC 812. This can provide isolation between the two elements. This extra layer is, however, optional, and is not required in all embodiments.

Figure 9:
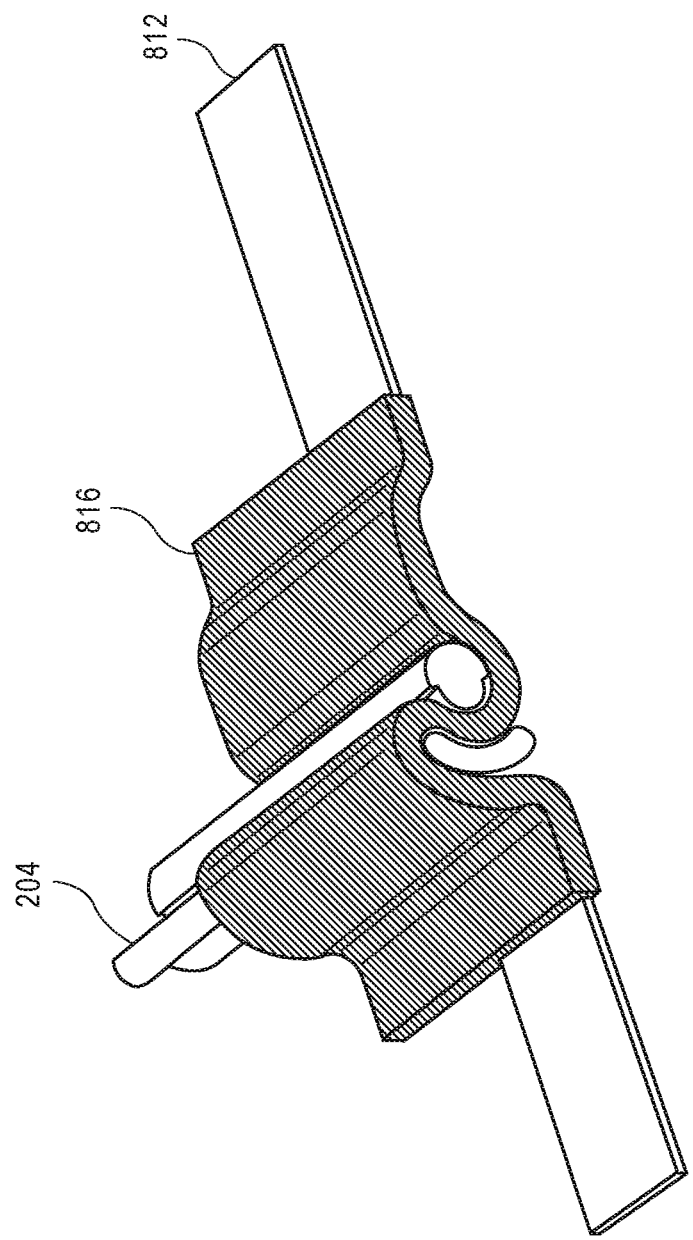
FIG. 9 is a cutaway perspective view of a guide with a silicone encasement and a flexible printed circuit (FPC) passing therethrough.

FIG. 9 is a cutaway perspective view of guide 204 with silicone encasement 816 and FPC 812 passing therethrough. One feature of guide 204 is that it provides pivoting within the chassis, and may include a circular hole or projection that provides a passage for a heat spreader and/or FPC to pass through. Guide 204 may also include a circular boss to accommodate a torsion spring such as spring 804 of FIG. 8. Pip 808 may be used for transferring the torsion spring load.

Guide 204 may interface with a pivot member that allows the guide assembly to be pivoted and rotate freely within second chassis 108. Biasing spring 808 is provided within guide 204, and may be grounded to the chassis base as it applies a torque sufficient to retract the heat spreader and/or FPC 812. Both chassis may have a split aperture to enable the heat spreader assembly to pass therethrough.

Figure 10:
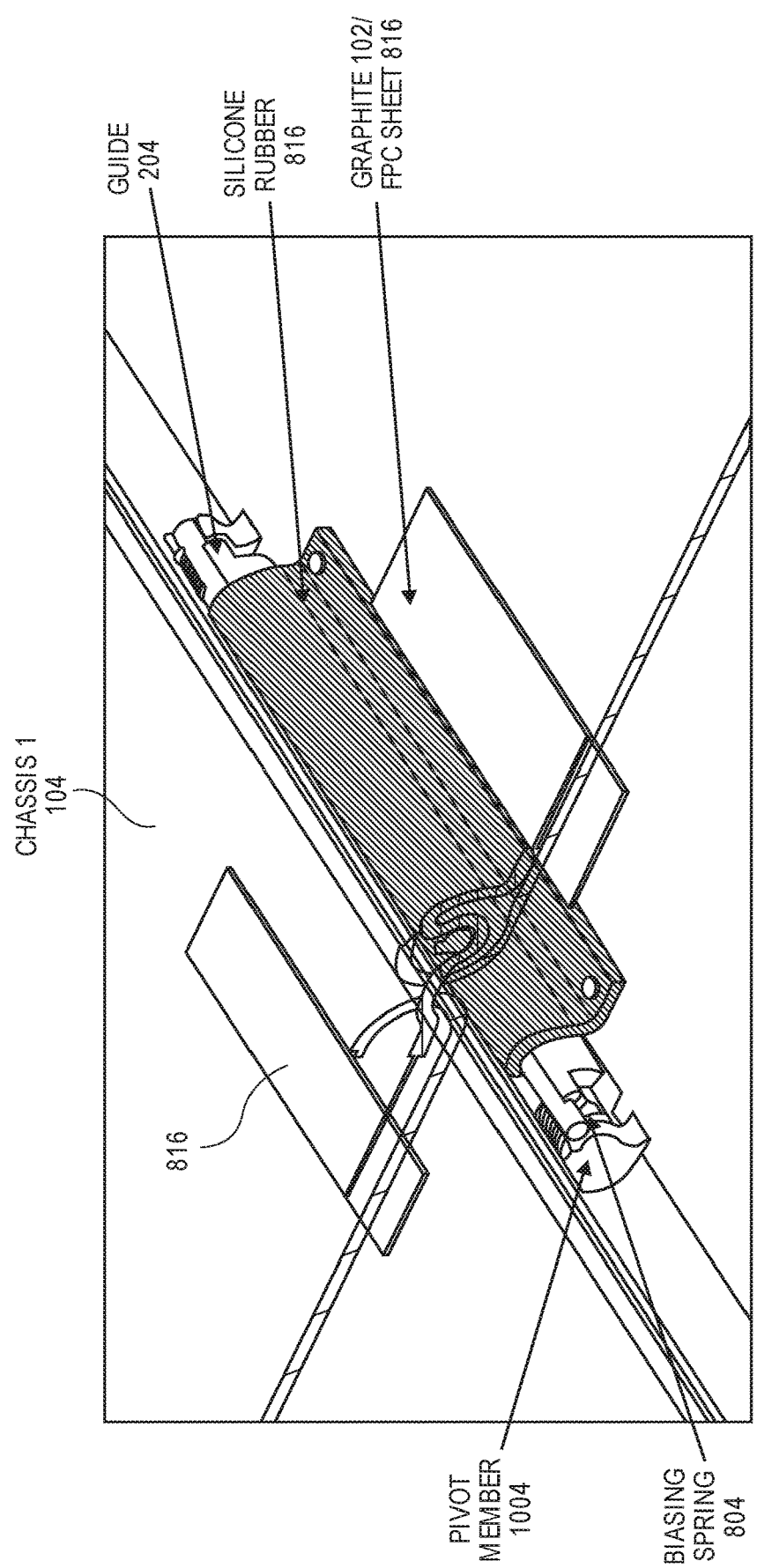
FIG. 10 illustrates the passage of a heat spreader assembly through a split aperture.

FIG. 10 illustrates this passage. In this example, guide 204 is provided within chassis 2 108, which in this illustration is cut away for clarity of the FIGURE. Chassis 1 104 provides FPC 816, heat spreader 102, and optionally other elements that may be encased within silicone rubber encasement 816. Pivot member 1004 allows guide 204 to rotate freely within chassis 108. Biasing spring 804 causes rotation of guide 204 to expand or retract silicone rubber encasement 816, responsive to the angle of the two chassis with respect to one another.

Experimentally, the configuration disclosed herein was tested according to a design requirement of 10,000 to 30,000 bend cycles. The test configuration included a four-layer stack of graphite heat spreaders, with each spreader being 25 microns, and with 6 microns of heat adhesive tape between each layer of graphite sheet. An additional 10 microns layer of polyester tape (PET) was provided to adhere the heat spreader to the device.

In testing, this configuration was found to meet a 30,000 bend cycle at 207° bends of 0.8 bend radius for the four layers of stacked graphite spreader.

Figure 11:
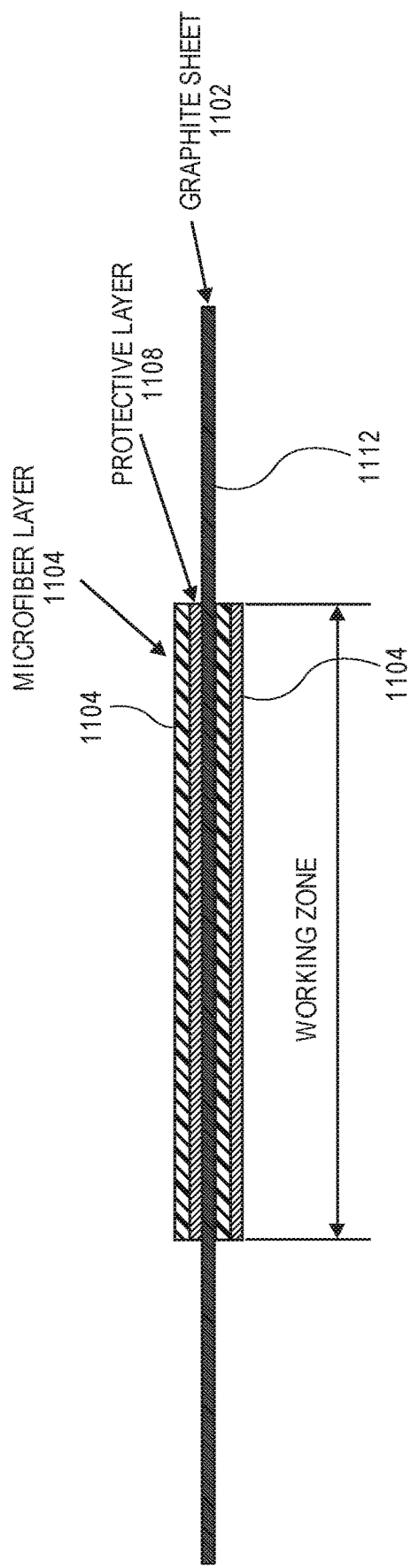
FIGS. 11-13 illustrate an alternative embodiment of a converged mobility device.
Figure 12:
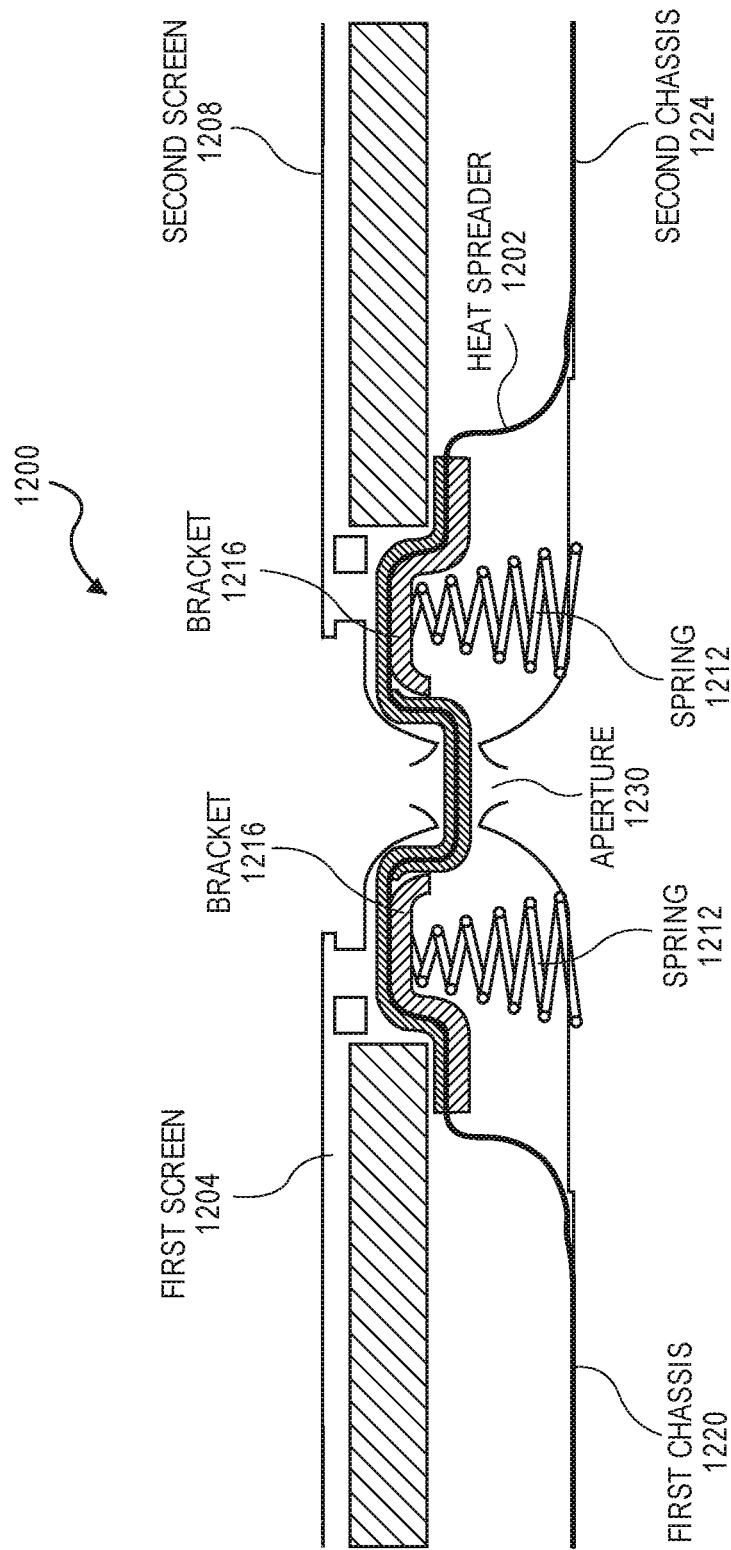
Figure 13:
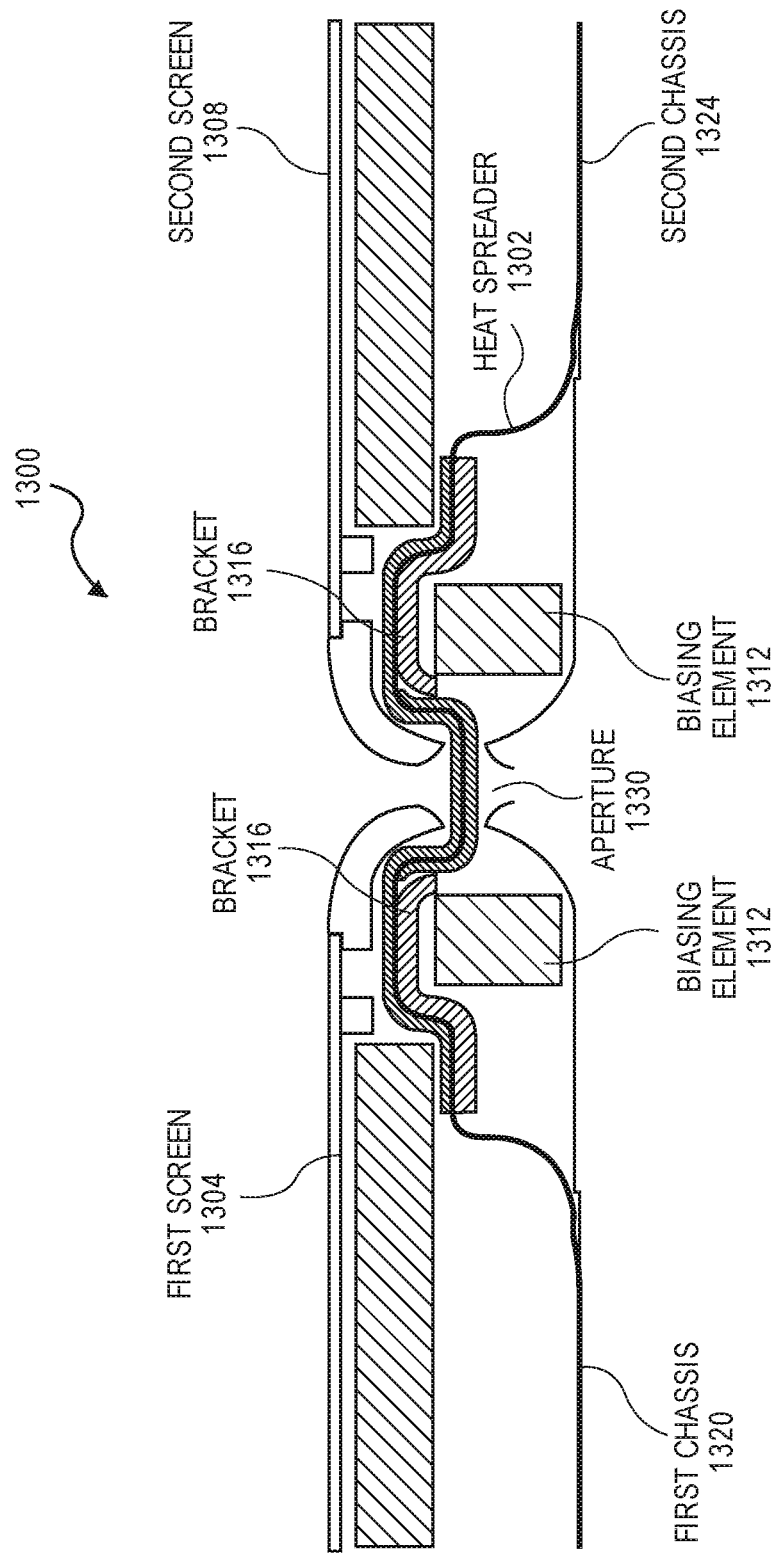

FIGS. 11-13 illustrate an alternative embodiment of a converged mobility device. In the embodiment illustrated by FIGS. 11 through 13, a biasing element such as a spring may be located within each chassis, and may bias against a structural element such as a metal bracket. This effectively provides expansion and contraction of the heat spreader as illustrated before, using a different mechanism. It should be noted that many of the elements disclosed in connection with FIGS. 1A through 10 are compatible with the teachings of this embodiment. For example, a guide similar to guide 204 may be employed with a hinge between the two chassis. But in this case, the guide is optionally not spring-loaded. Rather, the biasing is provided within the chassis themselves. Furthermore, the teachings about heat spreaders such as heat spreader 102, the disclosed configurations of heat spreaders (e.g., a four-layer graphite heat spreader by way of nonlimiting example), and the teachings relating to a silicone rubber encasement may also be applicable to the embodiment illustrated in FIGS. 11 through 13. In a more general sense, the teachings of FIGS. 1A through 10 are applicable to FIGS. 11 through 13, unless expressly stated otherwise.

The embodiment disclosed herein uses a combination of springs or compressible material as a biasing means to ensure that the spreader works in all orientations of the system and maintains a minimal section-to-section gap. Stated otherwise, the designs of both embodiments disclosed herein help to ensure that the heat spreader and other associated elements remain relatively taut between the two chassis, and do not sag or become loose.

It should also be noted that while the illustrations herein show a dual display system as an embodiment of the technology described, similar solutions may be applicable in passively-cooled clamshells and convertibles. In these cases, the compute resources are located in the base, and the display (lid) can be used as an extended surface for heat transfer, acting as a heat sink. Note that this may be an opposite arrangement to the illustrations shown herein, wherein the compute resources are illustrated in a first chassis that is a display.

The embodiment illustrated in FIGS. 11 through 13 provides a mechanism that allows the spreader or cable to extend out of the chassis when the device is in a closed or open position, and retracts when the device is in a flat, lying position. This also helps to ensure that the heat spreader is properly covered, both to protect the spreader from damage and to protect the user from touching a hot surface.

The teachings of this specification can be used to develop compute devices (e.g., convertible or dual display systems) with higher cooling of systems-on-a-chip and to maximize user performance. The system also provides a better ergonomic feel. In addition, the teachings herein also reduce the number of cables routed through the hinge, as the heat spreader can also be provided along with an FPC for cross-chassis routing. Because the number of routed cables is reduced, the cost of the hinge may be less, and yield rates may be increased. Furthermore, the teachings disclosed herein provide an enhanced number of bend cycles.

Illustrated in FIG. 11 is a graphite sheet 1102, which may have a thickness of approximately 100 microns (e.g., 0.1 mm). Graphite sheet 1102 may provide a thermal conductivity of greater than 700 W per millikelvin. Graphite sheet 1102 may be bonded to a working zone with a protective layer 1108. Protective layer 1108 may be approximately 0.15 mm (150 microns), and may comprise a nickel titanium alloy or a thin plastic layer such as polypropylene, which is widely used for these types of hinges. Protective layer 1108 may be covered by a microfiber layer 1104, which provides additional protection and cosmetic enhancement. Furthermore, microfiber layer 1104 and protective layer 1108 help to ensure that the user does not come into contact with a hot surface.

Turning to FIG. 12, additional details of a converged mobility device 1200 are disclosed. There is shown here a first chassis 1220 housing a first screen 1204. There is also shown a second chassis 1224, which houses a second screen 1208. Chassis 1220 and 1224 may each include an aperture 1230 of approximately 1 mm at the center of the respective chassis. This aperture may be a small slit, which allows passage of heat spreader 1202 along with supporting structures such as protective layer 1108 and microfiber layer 1104 to pass through the chassis. Protective layer 1108 and microfiber layer 1104 may be configured to substantially fill aperture 1230, thus preventing incursion of dust and other undesirable elements into chassis 1220 and 1224.

In this embodiment, each chassis is provided with a spring 1212 or other biasing means, which can bias directly against heat spreader assembly 1202, or against a rigid structural element such as a metal bracket 1216. This biasing action of springs 1212 naturally provides extension and retraction of heat spreader assembly 1202 when the angle of the device is changed, as illustrated in FIGS. 2 through 6. As in the previous embodiment, heat spreader 1202 may be at maximum retraction when the two chassis are at a 180° orientation with respect to one another, while heat spreader 1202 may be at maximum extension when the two chassis are at a 0° or 360° orientation with respect to one another. When the two chassis are at a 90° or 270° orientation with respect to one another, the heat spreader 1202 is at an intermediate extension.

Illustrated in FIG. 13 is a further embodiment of a converged mobility device 1300. Converged mobility device 1300 includes, similar to the other converged mobility devices illustrated herein, a first chassis 1320, a second chassis 1324, a first screen 1304 disposed within first chassis 1320, and a second screen 1308 disposed within second chassis 1324.

As before, a heat spreader assembly 1302 passes through an aperture 1330. Heat spreader 1302 and aperture 1330 may be substantially similar in construction and dimensions to heat spreader 1202 and aperture 1230 of FIG. 12.

In the illustration of FIG. 13, a biasing element 1312 is described. In this case, biasing element 1312 may include biasing means other than a metal or plastic spring. For example, biasing element 1312 may include a silicone gel pad or silicone gel foam. Because the silicone gel pad or foam biases similar to spring 1212, it provides similar extension and retraction of heat spreader 1302.

The biasing means, whether a spring or other biasing means, may be composed of metal, plastic, foam, or other suitable material. It may operate in a minimal load range of approximately 50 to 70 g.

In the case of spring 1212 of FIG. 12, the spring may be a conical shape made of 0.15 to 0.2 mm diameter wire, music wire, a plastic material wire, or a plastic or metal leaf spring. Other biasing elements could include any form of compressible pad of 4 to 6 mm wide, including silicone gel pad or foam.

With reference to the example of a dual display system, where the extreme orientations of the two displays are in the open mode and the closed mode, operation may be similar to that illustrated with respect to FIG. 1A. Namely, in a 0° orientation, the two displays may be facing one another. This may be a convenient mode for storage of the device.

Conversely, a 360° orientation may be a fully open mode where the backs of the two chassis are facing one another. This may be convenient for using the device in a phone mode.

In both of these modes, the heat spreader assembly is in its maximum extension.

When the two displays are in a 180° orientation with respect one another, the heat spreader assembly is in maximum retraction or decompression. When the two assemblies are in 90° or 270° orientation with respect one another, the heat spreader assembly is in an intermediate extension.

Figure 14:
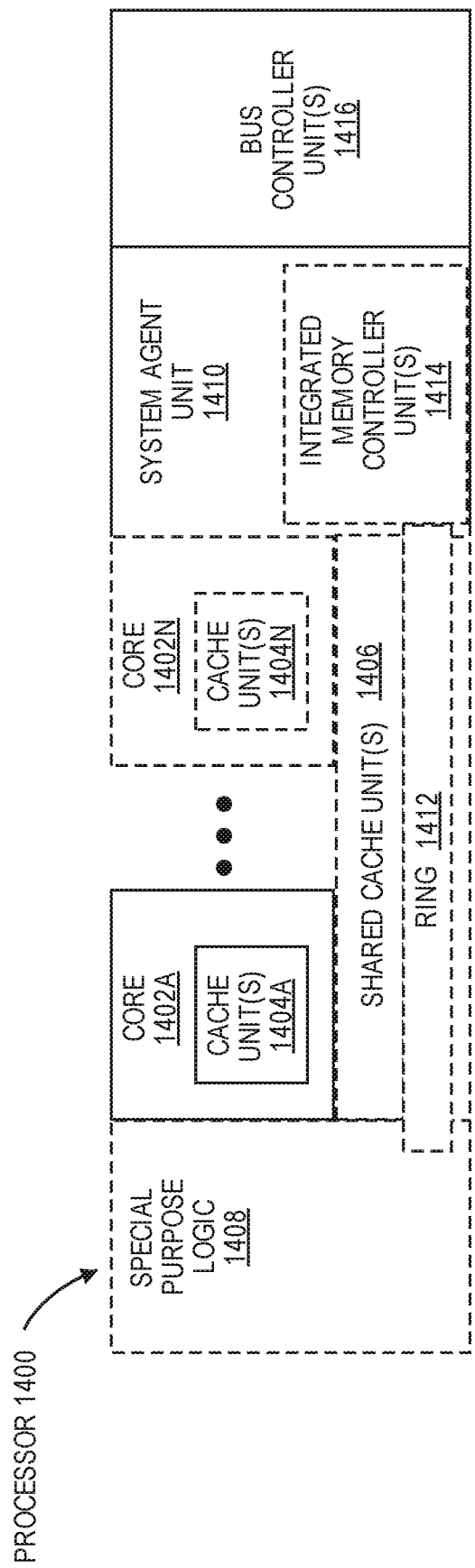
FIG. 14 is a block diagram of a processor that may have more than one core, may have an integrated memory controller, and may have integrated graphics.

FIG. 14 is a block diagram of a processor that may have more than one core, may have an integrated memory controller, and may have integrated graphics. The processor of FIG. 14 is a high performance processor that could be provided in any of the embodiments disclosed in the present specification.

Figure 15:
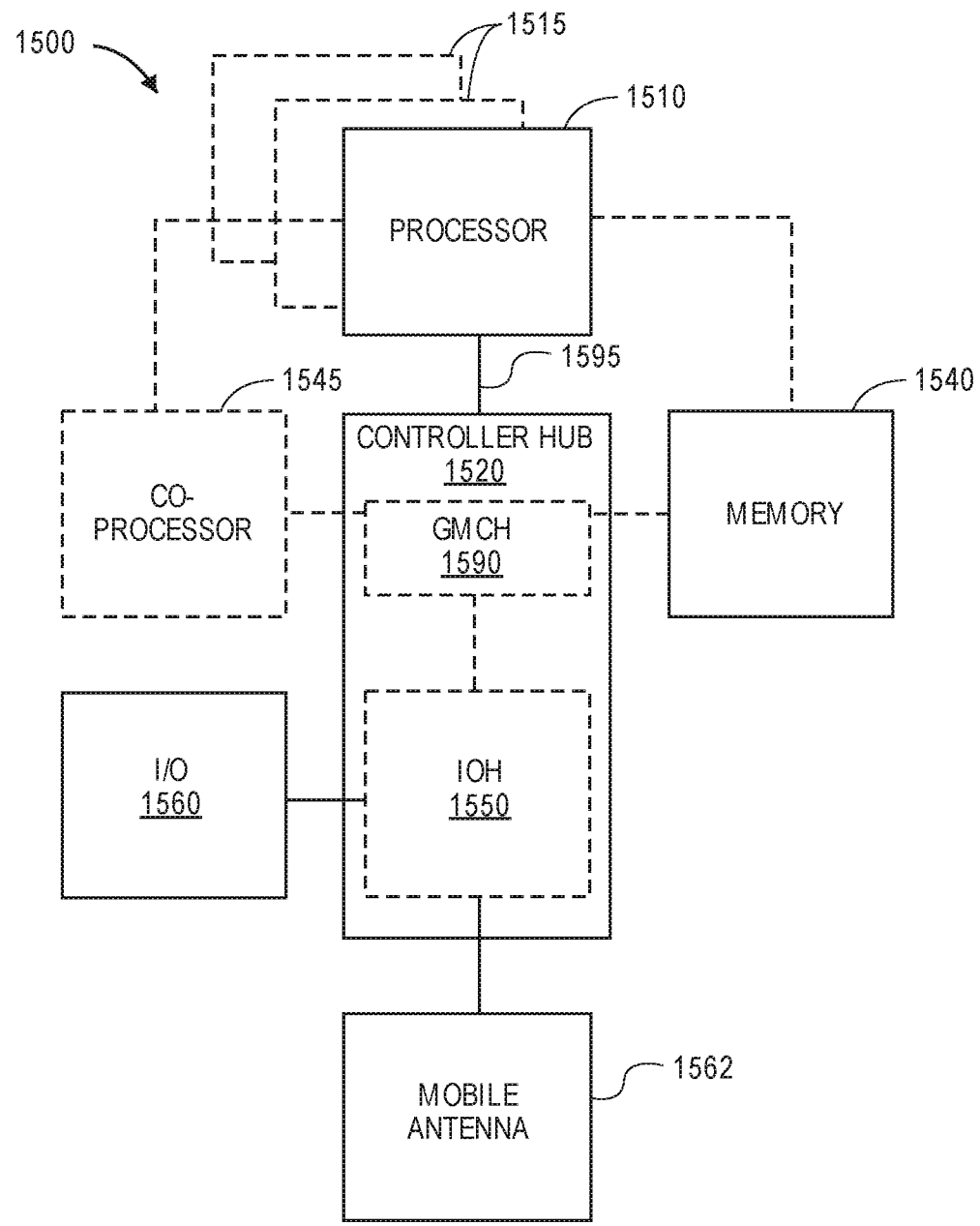
FIGS. 15-17 are block diagrams of computer architectures.
Figure 16:
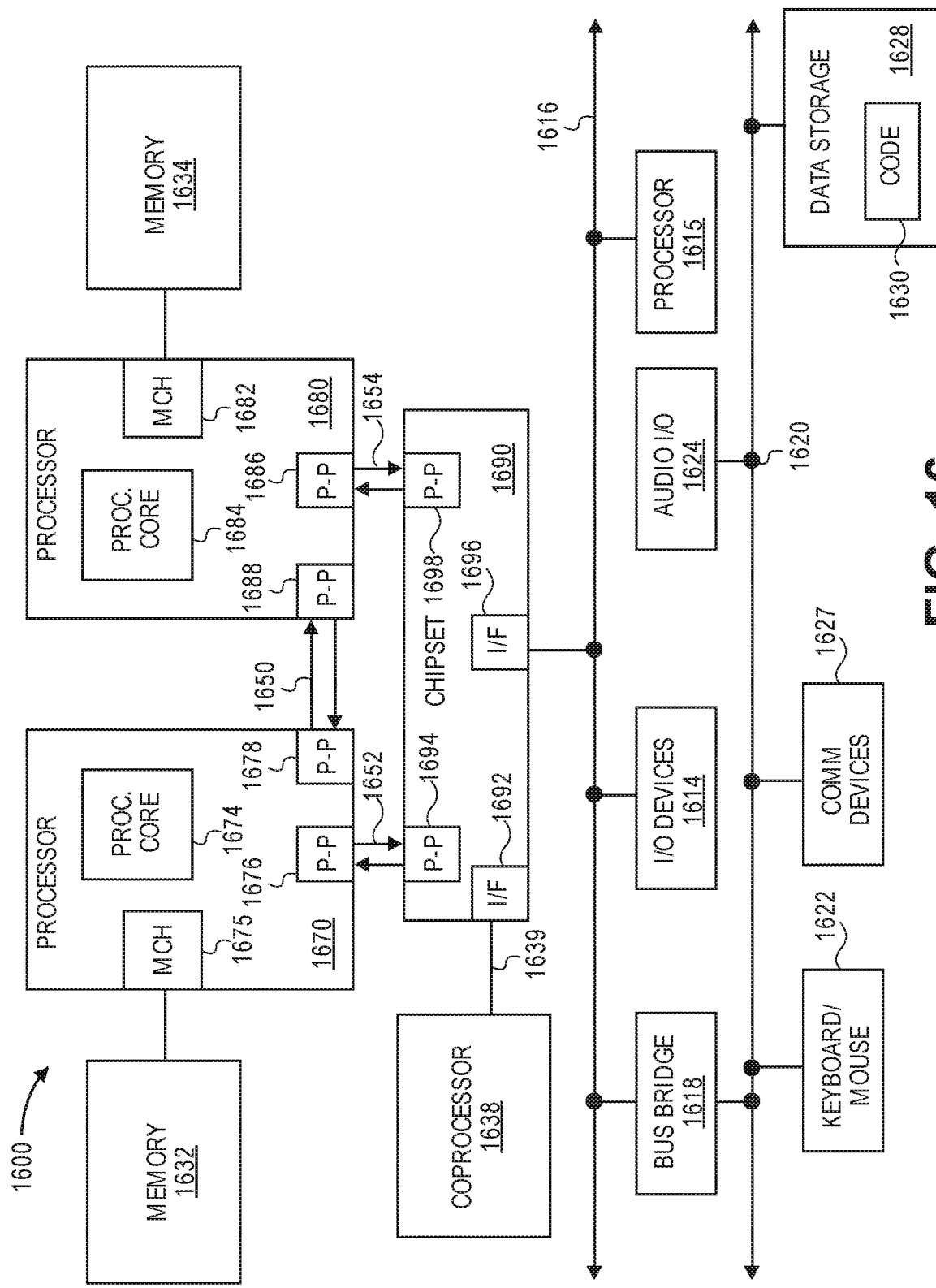
Figure 17:
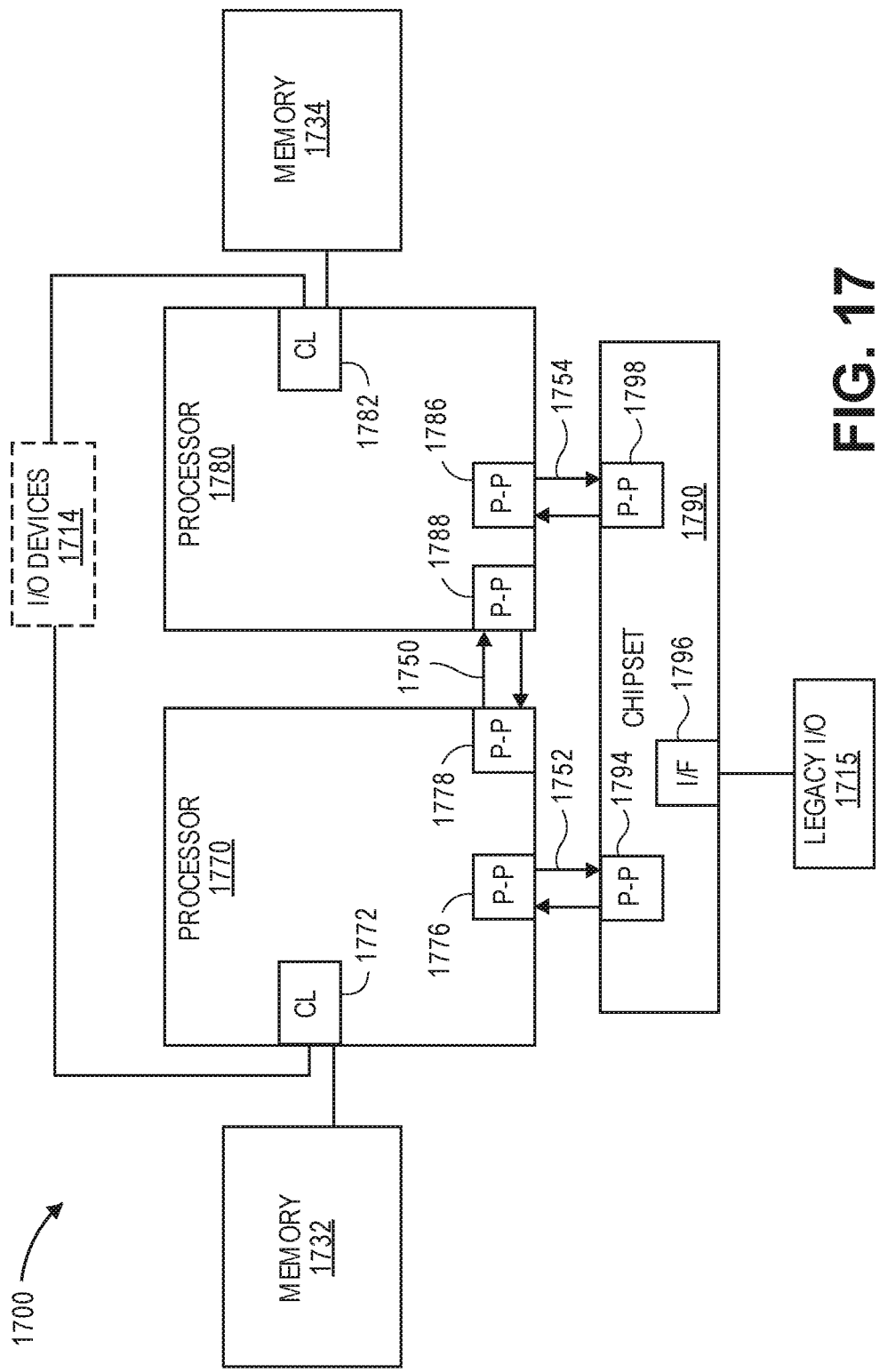

FIGS. 15-17 are block diagrams of example computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 15, shown is a block diagram of converged mobility device 1500, illustrating elements that may be provided within the scope of the present specification. The system 1500 may include one or more processors 1510, 1515, which are coupled to a controller hub 1520. In one embodiment the controller hub 1520 includes a graphics memory controller hub (GMCH) 1590 and an input/output hub (IOH) 1550 (which may be on separate chips); the GMCH 1590 includes memory and graphics controllers to which are coupled memory 1540 and a coprocessor 1545; the IOH 1550 couples input/output (I/O) devices 1560 to the GMCH 1590. Alternatively, one or both of the memory and graphics controllers are integrated within the processor (as described herein), the memory 1540 and the coprocessor 1545 are coupled directly to the processor 1510, and the controller hub 1520 in a single chip with the IOH 1550.

In the embodiment of FIG. 15, converged mobility device 1500 includes mobile antenna 1562, which may be provided to communicatively couple the device to a mobile network, such as a 4G long-term evolution (LTE) or later network, or any other suitable mobile network. Also in FIG. 15, note that I/O 1560 may communicatively couple converged mobility device 1500 to I/O devices, such as dual touchscreens, a keyboard, a software keyboard, or other I/O elements.

The optional nature of additional processors 1515 is denoted in FIG. 15 with broken lines. Each processor 1510, 1515 may include one or more of the processing cores described herein and may be some version of the processor 1400.

The memory 1540 may be, for example, dynamic random access memory (DRAM), phase change memory (PCM), or a combination of the two. For at least one embodiment, the controller hub 1520 communicates with the processor(s) 1510, 1515 via a multidrop bus, such as a frontside bus (FSB), point-to-point interface such as Ultra Path Interconnect (UPI), or similar connection 1595.

In one embodiment, the coprocessor 1545 is a special-purpose processor, such as, for example, a high-throughput many-integrated core (MIC) processor, a network or communication processor, compression engine, graphics processor, GPGPU, embedded processor, or the like. In one embodiment, controller hub 1520 may include an integrated graphics accelerator.

There can be a variety of differences between the physical resources 1510, 1515 in terms of a spectrum of metrics of merit including architectural, microarchitectural, thermal, power consumption characteristics, and the like.

In one embodiment, the processor 1510 executes instructions that control data processing operations of a general type. Embedded within the instructions may be coprocessor instructions. The processor 1510 recognizes these coprocessor instructions as being of a type that should be executed by the attached coprocessor 1545. Accordingly, the processor 1510 issues these coprocessor instructions (or control signals representing coprocessor instructions) on a coprocessor bus or other interconnect, to coprocessor 1545. Coprocessor(s) 1545 accepts and executes the received coprocessor instructions.

Referring now to FIG. 16, shown is a block diagram of a first more specific example system 1600. As shown in FIG. 16, multiprocessor system 1600 is a point-to-point interconnect system, and includes a first processor 1670 and a second processor 1680 coupled via a point-to-point interconnect 1650. Each of processors 1670 and 1680 may be some version of the processor 1400. In one embodiment, processors 1670 and 1680 are respectively processors 1510 and 1515, while coprocessor 1638 is coprocessor 1545. In another embodiment, processors 1670 and 1680 are respectively processor 1510 coprocessor 1545.

Processors 1670 and 1680 are shown including integrated memory controller (IMC) units 1672 and 1682, respectively. Processor 1670 also includes as part of its bus controller units point-to-point (P-P) interfaces 1676 and 1678; similarly, second processor 1680 includes P-P interfaces 1686 and 1688. Processors 1670, 1680 may exchange information via a point-to-point (P-P) interface 1650 using P-P interface circuits 1678, 1688. As shown in FIG. 16, IMCs 1672 and 1682 couple the processors to respective memories, namely a memory 1632 and a memory 1634, which may be portions of main memory locally attached to the respective processors.

Processors 1670, 1680 may each exchange information with a chipset 1690 via individual P-P interfaces 1652, 1654 using point-to-point interface circuits 1676, 1694, 1686, 1698. Chipset 1690 may optionally exchange information with the coprocessor 1638 via a high performance interface 1639. In one embodiment, the coprocessor 1638 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low-power mode.

Chipset 1690 may be coupled to a first bus 1616 via an interface 1696. In one embodiment, first bus 1616 may be a peripheral component interconnect (PCI) bus, or a bus such as a PCI Express bus or another third generation I/O interconnect bus, by way of nonlimiting example.

As shown in FIG. 16, various I/O devices 1614 may be coupled to first bus 1616, along with a bus bridge 1618 which couples first bus 1616 to a second bus 1620. Similar to I/O 1560 of FIG. 15, I/O devices 1614 may communicatively couple system 1600 to I/O devices, such as dual touchscreens, a keyboard, a software keyboard, or other I/O elements. In one embodiment, one or more additional processor(s) 1615, such as coprocessors, high-throughput MIC processors, GPGPUs, accelerators (such as, e.g., graphics accelerators or DSP units), field-programmable gate arrays, or any other processor, are coupled to first bus 1616. In one embodiment, second bus 1620 may be a low pin count (LPC) bus. Various devices may be coupled to a second bus 1620 including, for example, a keyboard and/or mouse 1622, communication devices 1627 and a storage unit 1628 such as a disk drive or other mass storage device which may include instructions or code and data 1630, in one embodiment. In some embodiments, keyboard/mouse 1622 may be provided in software, such as with a software keyboard, or in a semi-hardware configuration, wherein a chassis is dedicated to such I/O purposes, but is not provided as a true hardware keyboard. Communication devices 1627 may, in various embodiments, communicatively couple to a 4G LTE or next-generation mobile network. Further, an audio I/O 1624 may be coupled to the second bus 1620. Note that other architectures are possible. For example, instead of the point-to-point architecture of FIG. 16, a system may implement a multidrop bus or other such architecture.

Referring now to FIG. 17, shown is a block diagram of a second more specific example system 1700. FIGS. 16 and 17 bear like reference numerals, and certain aspects of FIG. 16 have been omitted from FIG. 17 in order to avoid obscuring other aspects of FIG. 17.

FIG. 17 illustrates that the processors 1670, 1680 may include integrated memory and I/O control logic ("CL") 1672 and 1682, respectively. Thus, the CL 1672, 1682 include IMC units and include I/O control logic. FIG. 17 illustrates that not only are the memories 1632, 1634 coupled to the CL 1672, 1682, but also that I/O devices 1714 are also coupled to the control logic 1672, 1682. Legacy I/O devices 1715 are coupled to the chipset 1690. As with I/O 1560 of FIG. 15 and I/O devices 1614 of FIG. 16, I/O devices 1714 and legacy I/O devices 1715 may communicatively couple system 1700 to I/O devices, such as dual touchscreens, a keyboard, a software keyboard, or other I/O elements.

Figure 18:
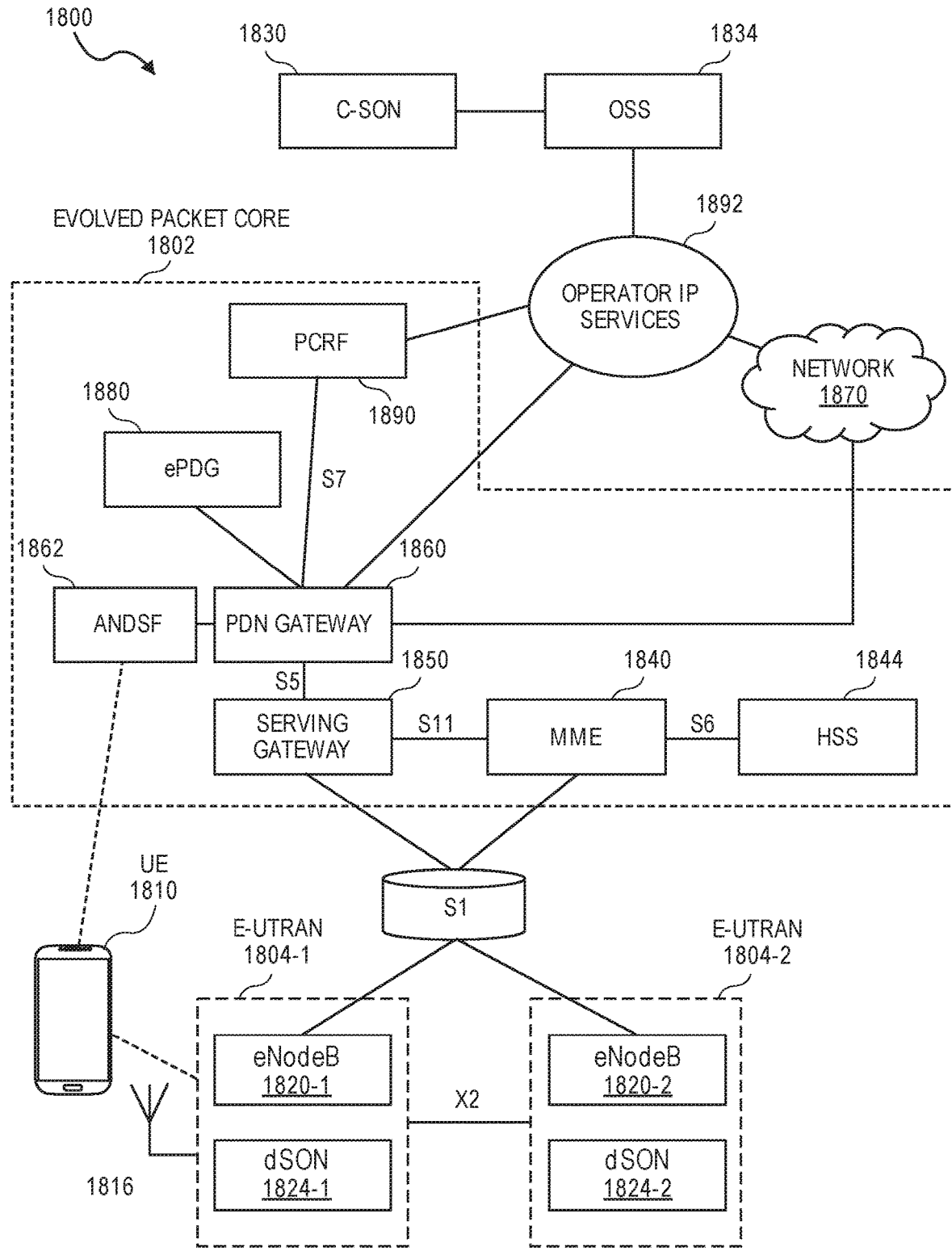
FIG. 18 is a block diagram of a mobile network, illustrating an embodiment in which any suitable device, including a converged mobility device as disclosed in the present specification, may operate.

FIG. 18 is a block diagram of a mobile network 1800, illustrating an example network in which any suitable device, including a converged mobility device as disclosed in the present specification, may operate. In this specific example, a fourth-generation long-term evolution (4G LTE, or simply LTE) network is disclosed by way of nonlimiting example. In certain embodiments, LTE is used primarily for data transfer, so that mobile network 1800 may also provide, in addition to the elements shown here, structure for handling voice communication, which may communicatively couple to a public-switched telephone network (PSTN). In some cases, voice over LTE (VoLTE) may also be provided. It should also be noted that LTE is disclosed only as one possible embodiment of the teachings of this Specification, and that the teachings may be relevant to other telecommunication structures now in existence or later developed, and the scope of this Specification is intended to encompass such structures where applicable.

In this example, mobile network 1800 includes user equipment (UE) 1810. UE 1810 may be any suitable mobile device, including any of the converged mobility or other devices discussed herein, including by way of example device 100 of FIG. 1, device 1200 of FIG. 12, device 1500 of FIG. 15, device 1600 of FIG. 16, or device 1700 of FIG. 17. UE 1810 may be communicatively coupled, for example via a wireless antenna 1816, to an evolved universal mobile telecommunications system (UMTS) radio access network (E-UTRAN) 1804. UE 1810 may initiate a data transaction or session with E-UTRAN 1804-1, referred to herein as a "data call." E-UTRAN 1804 communicatively couples to an evolved packet core (EPC) 1802, for example via wired connections. E-UTRAN 1804 may include, by way of nonlimiting example, an evolved NodeB (eNB) 1820, which acts as a wireless base station, and a distributed self-organizing network (dSON) controller 1824.

In various embodiments, these functions may be provided by dedicated servers or appliances. In other embodiments, select functions may be provided in virtual environments, such as a rack-mounted server providing various functions in a hypervisor. In a general sense, the various UE-class devices, server-class devices, network functions, may be generally classified as "computing devices." As used throughout this specification, a computing device includes any electrical or electronic device based on the Von Neumann architecture, including a processor with a control unit and logic unit, and a memory. In that context, it should be understood that the Von Neumann architecture may be provided either as a physical device, or as a virtual machine or hypervisor running at one or more layers of abstraction from the physical hardware.

In this example, two E-UTRANS 1804-1 and 1804-2 are disclosed to illustrate the mobile nature of the network. UE 1810 may move, for example, as a user carrying UE 1810 moves. As UE 1810 moves farther away from E-UTRAN 1804-1, its signal to E-UTRAN 1804 attenuates. If UE 1810 simultaneously moves closer to E-UTRAN 1804-2, its signal with E-UTRAN 1804-2 becomes stronger. When UE 1810 has moved such that it gets a stronger signal to E-UTRAN 1804-2 than to E-UTRAN 1804-1, E-UTRAN 1804-1 may hand off the data call to E-UTRAN 1804-2, so that E-UTRAN 1804-2 seamlessly continues handling the data call.

Handoff may be handled over the X2 interface. In this example, two classes of signals are passed within mobile network 1800: voice, data, and call signals (referred to herein as the "user plane" signals) and control signals (referred to herein as the "control plane" signals). X2 provides both a control plane interface and a user plane interface, and in an embodiment is a wired connection between the two E-UTRANs 1804. The protocol structure of the S1 control plane is based on stream control transmission protocol/Internet protocol (SCTP/IP). The user plane provides a protocol structure based on general packet radio service (GPRS) tunneling protocol/user datagram protocol/IP (GTP/UDP5/IP). On the user plane, a transport bearer may be identified by an IP address and one or more GTP tunneling endpoint IDs (TEID). X2 operates as a meshed interface, meaning that a plurality of eNBs 1820 may all be linked together. Properly configured, X2 helps to minimize packet loss as UE 1810 hands off from one E-UTRAN 1804 to another. Specifically, when the data call is handed off, unsent or unacknowledged packets stored in the old eNB 1820's queues can be forwarded or tunneled to the new eNB 1820 via the X2 interface.

E-UTRANs 1804 communicatively couple to an EPC 1802 via an S1 interface. As with the X2 interface, S1 provides both a control plane and a user plane, configured similarly to the respective X2 control plane and user plane. In an embodiment, the S1 application protocol (S1-AP) is mapped directly on top of SCTP.

In this example, EPC 1802 includes a serving gateway (SGW) 1850, a mobility management entity (MME) 1840, a home subscriber server (HSS) 1844, a packet data network (PDN) gateway 1860, an evolved packet data gateway (ePDG) 1880, and policy and charging rules function (PCRF) 1890. EPC 1802 for its part may communicatively couple, via appropriate interfaces, to a public network such as Internet 1870, or to operator IP services 1892.

When UE 1810 is performing data operations, such as web applications, web surfing, e-mail, or other network operations, UE 1820 connects to Internet 1870 via mobile network 1800. In one example scenario, user plane signals originate from UE 1810 and are passed to E-UTRAN 1804. Within E-UTRANs 1804, user plane signals are first received by eNB 1820 (or other similar base station), which interfaces with EPC 1802 to handle the data call.

As a wireless local area network (WLAN) access point (WAP), eNB 1820 supports Layer 1 and Layer 2 of the E-UTRAN orthogonal frequency division multiplexing (OFDM) physical interface. Advantageously, eNBs 1820 may directly connect to a network router, thus simplifying network architecture. Further, eNB 1820 may support certain legacy features related to physical layer procedures for transmitting and receiving, including modulation and demodulation, and channel encoding and decoding. Additionally, eNB 1820 may also provide radio resource control and radio mobility management for processing handovers.

EPC 1802 provides several functional blocks to provide various support functions. These are described herein by way of nonlimiting example only.

MME 1840 provides control functions to EPC 1802. MME 1840 provides idle mode UE paging and tagging procedures, including retransmissions. MME 1840 also provides bearer activation and deactivation support, and may choose an appropriate SGW 1850 for UE 1810 when UE 1810 initially attaches to EPC 1802 via E-UTRAN 1804. After attachment, MME 1840 authenticates UE 1810 via HSS 1844.

Non-access stratum signaling terminates at MME 1840, and MME 1840 is also responsible for generating and allocating a temporary identity for UE 1810. MME 1840 then verifies the authorization of UE 1810 to resources on the service provider's public land mobile network (PLMN), and enforces roaming restrictions on UE 1810. MME 1840 is also a terminal endpoint for ciphering/integrity protection for non-access stratum (NAS) signaling, and handles security key management. MME 1840 also supports lawful signal interception. MME 1840 also provides control plane functions for mobility between LTE and 2G/3G networks with the S3 interface terminating at MME 1840 from, for example, a 3G serving GPRS support node (SGSN). Finally, MME 1840 terminates the S6a interface of HSS 1844 for roaming UEs.

HSS 1844 is, in an embodiment, a database server to provide home location register (HLR) and authentication center (AuC) services. The functions of the HSS include call and session establishment support, user authentication, and access authorization, by way of nonlimiting example.

In an embodiment, HLR stores and updates a user subscription information database. This may include the following, by way of nonlimiting example:

a. User identification and addressing, including the International Mobile Subscriber Identity (IMSI), Mobile Subscriber ISDN Number (MSISDN), and/or mobile telephone number.

b. User profile information, including subscriptions and quality of service (QoS) data.

AuC generates security data from user identity keys, and provides the data to at least the HLR, and as necessary, to other functional blocks.

SGW 1850 forwards user data packets, while also acting as the mobility anchor for the user plane during inter-eNodeB handovers and as the anchor for mobility between LTE and other 3GPP technologies (terminating S4 interface and relaying the traffic between 2G/3G systems and PDN Gateway 1850). When UE 1810 is idle, SGW 1850 terminates the downlink data path and triggers paging when downlink data arrives for UE 1810. SGW 1850 may also store UE contexts including parameters of the IP bearer service and network internal routing information. It also performs replication of the user traffic in case of lawful interception.

PDN Gateway 1860 provides connectivity from UE 1810 to external PDNs and provides both an entry point and exit point for UE traffic. UE 1810 may simultaneously connect to more than one PDN Gateway 1850, and thus may access multiple PDNs. In an example, PDN Gateway 1850 provides policy enforcement, packet filtering on a per-user basis, charging support, lawful interception, and packet screening, by way of nonlimiting example.

Access Network Discovery and Selection Function (ANDSF) 1862 helps UE 1810 discover non-3GPP access networks, such as Wi-Fi or WIMAX, that can be used in addition to the LTE network for data communication. ANDSF 1860 may provide UE 1810 with rules policing the connection to such networks. ANDSF 1860 may provide the following to UE, by way of nonlimiting example:

a. Inter-system mobility policy (ISMP)—network selections rules for when UE 1810 has no more than one active access network connection (e.g., either LTE or Wi-Fi).

b. Inter-system routing policy (ISRP)—network selection rules for when UE 1810 has potentially more than one active access network connection (e.g., both LTE and Wi-Fi). In this case, UE 1810 may employ IP flow mobility, multiple-access PDN connectivity (MAPCON), or non-seamless Wi-Fi offload according to policy and user preferences.

c. Discovery information—a list of networks that may be available in the vicinity of UE 1810, and information to help UE 1810 connect to these networks.

ANDSF 1862 may communicates with the UE 1810 over the S14 reference point, which in some embodiments is specific to ANDSF.

PCRF 1890 provides, in an embodiment, both policy decision functions (PDF) and charging rules functions (CRF).

PDF makes policy decisions. Specifically, when an IP multimedia subsystem (IMS) is set up, session initiation protocol (SIP) data include media requirements, which the terminal and proxy call session control function (P-CSCF) may exchange between themselves. During the session establishment process, the PDF may also receive those requirements from the P-CSCF and make decisions based on network operator rules. These may include, by way of nonlimiting example:
  a. Allowing or rejecting a media request.
  b. Using new or existing programmed data processor (PDP) context for an incoming media request.
  c. Checking allocation of resources against authorized resource usage.

The CRF provides operator-defined charging rules applicable to each service data flow. The CRF selects the relevant charging rules based on information provided by the P-CSCF, such as Application Identifier, Type of Stream (audio, video, etc.), or Application Data Rate, by way of nonlimiting example.

Data transmission is secured by ePDG 1880 with a UE 1810 connected to EPC 1802 over an untrusted, non-3GPP access. For this purpose, the ePDG acts as a termination node of IPsec tunnels established with UE 1810.

Network 1870 may be any suitable network or combination of one or more networks operating on one or more suitable networking protocols, including for example, a local area network, an intranet, a virtual network, a wide area network, a wireless network, a cellular network, or the Internet (optionally accessed via a proxy, virtual machine, or other similar security mechanism) by way of nonlimiting example. Network 1870 may also include one or more servers, firewalls, routers, switches, security appliances, antivirus servers, or other useful network devices. In this illustration, network 1870 is shown as a single network for simplicity, but in some embodiments, network 1870 may include a large number of networks, such as one or more enterprise intranets connected to the Internet.

Operator IP services 1892 include services provided by an operator of EPC 1802. Operator IP services 1892 may include, or may communicatively couple to an operations support system (OSS) 1832. OSS 1832 provides hardware and software for monitoring, controlling, analyzing, and managing EPC 1802.

Advantageously, LTE provides for self-organizing networks (SONs) (also sometimes called a self-optimizing network, which is used interchangeably). SON provides automation methods to facilitate planning, configuring, managing, optimizing, and healing a network such as EPC 1802 and E-UTRAN 1804.

SON may be provided in different flavors, including for example centralized SON (C-SON) 1830, distributed SON (dSON) 1824, and in some cases hybrid SON (hSON).

C-SON 1830 provides centralized higher-level network control, with increased coordination between nodes for functions such as load balancing across a wide geographic area. In contrast, dSON 1824 provides a distributed, peer-to-peer control function, in which each E-UTRAN network wirelessly receives reported parameters from other E-UTRANs, and makes autonomous decisions based on those reports. hSON (not shown in this illustration) provides a hybrid solution in which some functions are centralized and others are distributed.

Advantageously, SON provides useful functions such as:
  a. Self-Configuration. In a self-configuration network, new base stations are automatically configured and integrated into the network, and new features on a base station are also seamlessly integrated. When a new base station is introduced into the network and powered on, it is immediately recognized and registered by the network. The neighboring base stations then automatically adjust to provide the required coverage and capacity, as well as to avoid the interference.
  b. Self-Optimization. Base station such as eNBs 1820 may provide configuration parameters intended to control and/or optimize their behavior. Based on observations of both eNB 1820 itself, and measurements at UE 1810 or elsewhere, a SON may automatically reconfigure these parameters to enhance network efficiency. In another embodiment, SON provides automatic neighbor relations (ANR), and optimizes random access parameters or mobility robustness. In yet another embodiment, SON switches off some number of base stations at night to conserve power. These base stations may be selected to ensure that full coverage is still provided in a coverage area. Neighboring base station may reconfigure appropriate parameters to ensure full coverage and adjust to the changed network topology. If a sudden spike in demand occurs, one or more sleeping base stations may wake up almost instantaneously. This may realize significant power savings without sacrificing network
  c. Self-Healing. If a network node (such as an eNB 1820) goes down, self-healing helps to mitigate the effect of the failure on the overall network. For example a SON may adjust parameters and algorithms in adjacent eNBs 1820 so that they can continue to provide service to the failed eNB 1820. This is in contrast to legacy networks, where substantial time and resources may need to be committed to repairs when a base station fails. With self-healing networks, the network may automatically and nearly-instantaneously self-adjust with little or no service interruption.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the FIGURES may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid-state drive, a flash memory, or other nonvolatile medium. A computer-readable medium could also include a medium such as a read-only memory (ROM), a field-programmable gate array (FPGA) or application-specific integrated circuit (ASIC) configured to carry out the desired instructions, stored instructions for programming an FPGA or ASIC to carry out the desired instructions, an IP block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a central processing unit (CPU) package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

EXAMPLE IMPLEMENTATIONS

Example 1 includes a computing apparatus, comprising: a first chassis comprising primary operational circuitry of the computing apparatus; a second chassis hingeably coupled to the second chassis, the second chassis having substantially less operational circuitry than the first chassis whereby the operational circuitry of the second chassis generates substantially less heat than the operational circuitry of the first chassis; and a heat spreader between the first chassis and second chassis and disposed to dissipate generated heat from the first chassis into the second chassis.

Example 2 includes the computing apparatus of example 1, further comprising means to extend and retract the heat spreader responsive to an angle of rotation between the first chassis and second chassis.

Example 3 includes the computing apparatus of example 1, further comprising a guide hinge disposed between the first chassis and second chassis, wherein the heat spreader passes through the guide hinge.

Example 4 includes the computing apparatus of example 3, wherein the guide hinge comprises biasing means to extend and retract the heat spreader responsive to an angle of rotation between the first chassis and second chassis.

Example 5 includes the computing apparatus of example 3, wherein the guide hinge comprises a coil spring to bias the guide hinge to extend and retract the heat spreader responsive to an angle of rotation between the first chassis and second chassis.

Example 6 includes the computing apparatus of any of examples 1-5, wherein the heat spreader comprises a flexible graphite sheet.

Example 7 includes the computing apparatus of example 6, wherein the flexible graphite sheet has a thickness of between approximately 50 microns and approximately 100 microns.

Example 8 includes the computing apparatus of example 6, wherein the flexible graphite sheet comprises four graphite layers.

Example 9 includes the computing apparatus of any of examples 1-5, wherein the heat spreader comprises a metal alloy.

Example 10 includes the computing apparatus of any of examples 1-5, wherein the first chassis and second chassis are configured to provide full 360° rotation between the first chassis and second chassis.

Example 11 includes the computing apparatus of any of examples 1-5, wherein the first and second chassis comprise first and second touch screens respectively.

Example 12 includes the computing apparatus of any of examples 1-11, further comprising a flexible printed circuit (FPC) disposed between the first chassis and the second chassis.

Example 13 includes the computing apparatus of any of examples 1-11, further comprising a protective layer, wherein the heat spreader is encased within the protective layer.

Example 14 includes the computing apparatus of example 13, wherein the protective layer comprises a silicone rubber.

Example 15 includes the computing apparatus of example 13, wherein the protective layer comprises microfiber.

Example 16 includes the computing apparatus of example 13, wherein the protective layer comprises an inner silicone rubber layer and an outer microfiber layer.

Example 17 includes a computing apparatus, comprising: a first chassis comprising primary operational circuitry of the computing apparatus and having a first slit aperture; a second chassis hingeably coupled to the second chassis, the second chassis having substantially less operational circuitry than the first chassis whereby the operational circuitry of the second chassis generates substantially less heat than the operational circuitry of the first chassis, the second chassis having a second slit aperture at a near end to the slit aperture of the first chassis; a heat spreader passed through the first slit aperture and the second slit aperture; and biasing means to bias the heat spreader to extend and retract responsive to an angle of rotation between the first and second chassis.

Example 18 includes the computing apparatus of example 17, wherein the biasing means comprise a conical metal spring in each of the first and second chassis.

Example 19 includes the computing apparatus of example 17, wherein the biasing means comprise a plastic spring in each of the first and second chassis.

Example 20 includes the computing apparatus of example 17, wherein the biasing means comprise a compressible pad in each of the first and second chassis.

Example 21 includes the computing apparatus of example 17, wherein the biasing means are configured to operate in a range of 50 to 70 grams.

Example 22 includes the computing apparatus of any of examples 17-21, wherein the heat spreader comprises a flexible graphite sheet.

Example 23 includes the computing apparatus of example 22, wherein the flexible graphite sheet has a thickness of between approximately 50 microns and approximately 100 microns.

Example 24 includes the computing apparatus of example 23, wherein the flexible graphite sheet comprises four graphite layers.

Example 25 includes the computing apparatus of any of examples 17-24, wherein the heat spreader comprises a metal alloy.

Example 26 includes the computing apparatus of any of examples 17-24, further comprising a flexible printed circuit (FPC) disposed between the first chassis and the second chassis.

Example 27 includes the computing apparatus of any of examples 17-24, further comprising a protective layer, wherein the heat spreader is encased within the protective layer.

Example 28 includes the computing apparatus of example 27, wherein the protective layer comprises a silicone rubber.

Example 29 includes the computing apparatus of example 27, wherein the protective layer comprises microfiber.

Example 30 includes the computing apparatus of example 27, wherein the protective layer comprises an inner silicone rubber layer and an outer microfiber layer.

Example 31 includes a converged mobility device, comprising: a first chassis comprising a first touch screen, the first chassis having primary operational circuitry of the computing apparatus and having a first slit aperture; a second chassis comprising a second touch screen, the second chassis hingeably coupled to the second chassis, the second chassis having substantially less operational circuitry than the first chassis whereby the operational circuitry of the second chassis generates substantially less heat than the operational circuitry of the first chassis, the second chassis having a second slit aperture at a near end to the slit aperture of the first chassis; a heat spreader passed through the first slit aperture and the second slit aperture; and biasing means to bias the heat spreader to extend and retract responsive to an angle of rotation between the first and second chassis.

Example 32 includes the computing apparatus of example 31, wherein the biasing means comprise a spring-loaded guide to hingeably couple the first chassis to the second chassis, wherein the heat spreader passes through the spring-loaded guide, and the spring-loaded guide is configured to rotate responsive to an angle of rotation between the first chassis and second chassis.

Example 33 includes the computing apparatus of example 31, wherein the biasing means comprise a first spring in the first chassis and second spring in the second chassis, the first spring and second spring disposed to bias the heat spreader in a common direction when the two chassis are at a 180° angle of rotation with respect to one another.

Example 34 includes the computing apparatus of example 31, further comprising a first bracket and second bracket to distribute force of the first spring and second spring respectively.

Example 35 includes the computing apparatus of example 31, wherein the first and second springs are conical metal springs.

Example 36 includes the computing apparatus of example 31, wherein the first and second springs are coil springs.

Example 37 includes the computing apparatus of example 31, wherein the first and second springs are plastic springs.

Example 38 includes the computing apparatus of example 31, wherein the first and second springs are compressible pads.

Example 39 includes the computing apparatus of example 38, wherein the compressible pads are silicone gel pads.

What is claimed is:
1. An electronic device, comprising:
a first chassis including a processor, memory, and having a first slit aperture;
a second chassis coupled to the first chassis, the second chassis having a second slit aperture at an end near to the first slit aperture of the first chassis;
a flexible heat spreader that extends from the first chassis, through the first slit aperture and the second slit aperture, and to the second chassis; and
biasing means to bias the flexible heat spreader to extend and retract responsive to an angle of rotation between the first and second chassis, wherein the biasing means extends and retracts a length of the flexible heat spreader as the second chassis is rotated relative to the first chassis and the biasing means includes a compressible pad in each of the first chassis and the second chassis.

2. The electronic device of claim 1, wherein the flexible heat spreader is a flexible graphite sheet.

3. The electronic device of claim 1, wherein the biasing means are configured to operate in a load range of 50 to 70 grams.

4. The electronic device of claim 1, wherein the second chassis has substantially less operational circuitry than the first chassis whereby the operational circuitry of the second chassis generates substantially less heat than the operational circuitry of the first chassis.

5. The electronic device of claim 1, wherein the flexible heat spreader has a thickness of between approximately 50 microns and approximately 100 microns.

6. The electronic device of claim 1, wherein the flexible heat spreader includes a metal alloy.

7. A portable electronic device, comprising:
a first chassis including a processor and memory and having a first slit aperture;
a second chassis coupled to the first chassis, the second chassis having a touchscreen and a second slit aperture at an end near to the first slit aperture of the first chassis; and
a flexible heat spreader between the first chassis and the second chassis disposed to dissipate generated heat from the first chassis into the second chassis; and
biasing means to bias the flexible heat spreader to extend and retract responsive to an angle of rotation between the first and second chassis, wherein the biasing means extends and retracts a length of the flexible heat spreader as the second chassis is rotated relative to the first chassis and the biasing means includes a plastic spring.

8. The portable electronic device of claim 7, wherein the flexible heat spreader is a flexible graphite sheet.

9. The portable electronic device of claim 7, wherein the biasing means increases or decreases a height of a fold of the flexible heat spreader to extend and retract the flexible heat spreader responsive to an angle of rotation between the first chassis and the second chassis.

10. The portable electronic device of claim 7, wherein the flexible heat spreader passes over the biasing means.

11. The portable electronic device of claim 7, wherein the second chassis has substantially less operational circuitry than the first chassis whereby the operational circuitry of the second chassis generates substantially less heat than the operational circuitry of the first chassis.

12. The portable electronic device of claim 7, wherein the flexible heat spreader is a flexible graphite sheet.

13. A converged mobility device comprising:
a first chassis comprising processing elements, the first chassis having a first slit aperture;
a second chassis having less operational circuitry than the first chassis and comprising a touch screen, the second chassis having a second slit aperture at a near end to the first slit aperture of the first chassis;
a flexible graphite heat spreader passed through the first slit aperture and the second slit aperture; and
biasing means to extend and retract a length of the flexible graphite heat spreader as the second chassis is rotated relative to the first chassis, wherein the biasing means includes a compressible pad in each of the first chassis and the second chassis.

14. The converged mobility device of claim 13, wherein the biasing means includes a first spring in the first chassis and a second spring in the second chassis, the first spring and the second spring disposed to bias the flexible graphite heat spreader in a common direction when the first chassis and the second chassis are at a 180° angle of rotation with respect to one another.

\* \* \* \* \*